United States Patent
Osako et al.

(10) Patent No.: US 7,427,032 B2
(45) Date of Patent: Sep. 23, 2008

(54) ADAPTER FOR A MEMORY CARD AND A MEMORY CARD

(75) Inventors: Junichiro Osako, Kodaira (JP); Hirotaka Nishizawa, Fuchu (JP); Kenji Osawa, Hachioji (JP); Hideo Koike, Yokohama (JP)

(73) Assignee: Renesas Technology Corp., Tokyo (JP)

( * ) Notice: Subject to any disclaimer, the term of this patent is extended or adjusted under 35 U.S.C. 154(b) by 166 days.

(21) Appl. No.: 11/361,957

(22) Filed: Feb. 27, 2006

(65) Prior Publication Data

US 2006/0194479 A1 Aug. 31, 2006

(30) Foreign Application Priority Data

Feb. 28, 2005 (JP) .............. 2005-053684

(51) Int. Cl.
*G06K 19/06* (2006.01)
(52) U.S. Cl. .............. 235/492; 235/451; 235/380; 439/638
(58) Field of Classification Search ............ 235/492, 235/451, 487, 441, 380; 439/638, 630; 361/737
See application file for complete search history.

(56) References Cited

U.S. PATENT DOCUMENTS

| | | | | |
|---|---|---|---|---|
| 5,296,692 | A * | 3/1994 | Shino | 235/486 |
| 6,761,320 | B1 * | 7/2004 | Chen | 235/492 |
| 6,859,369 | B2 * | 2/2005 | Mambakkam et al. | 361/737 |
| 6,994,263 | B2 * | 2/2006 | Ueda et al. | 235/492 |
| 7,104,809 | B1 * | 9/2006 | Huang | 439/76.1 |
| 7,179,129 | B1 * | 2/2007 | Hwang | 439/630 |
| 7,306,160 | B2 * | 12/2007 | Takiar et al. | 235/492 |
| 2003/0095386 | A1 * | 5/2003 | Le et al. | 361/737 |
| 2003/0109179 | A1 * | 6/2003 | Kaneshiro et al. | 439/638 |

FOREIGN PATENT DOCUMENTS

| | | |
|---|---|---|
| JP | 2004-133516 A | 4/2004 |
| JP | 2004-348557 A | 12/2004 |

* cited by examiner

*Primary Examiner*—Edwyn Labaze
(74) *Attorney, Agent, or Firm*—Miles & Stockbridge P.C.

(57) ABSTRACT

An adapter for a memory card is disclosed which performs a change of size so that a memory card smaller in planar size but almost equal in thickness as compared with a multi-media card can be used as a multi-media card. A protuberant portion is formed behind plural external terminals formed on a back side of the adapter, whereby, while the thickness of a front side of the adapter is maintained at a standardized thickness of the multi-media card, a rear side of the adapter is made thicker than the front side and internal terminals for contact with external terminals of the memory card are disposed in the interior of the thick portion of the adapter. The versatility of an extremely small-sized memory card can be improved.

15 Claims, 25 Drawing Sheets

ADAPTER FOR A MEMORY CARD AND A MEMORY CARD

CROSS-REFERENCE TO RELATED APPLICATION

The present application claims priority from Japanese patent application No. 2005-053684 filed on Feb. 28, 2005, the content of which is hereby incorporated by reference into this application.

BACKGROUND OF THE INVENTION

The present invention relates to a technique on an adapter for a memory card and a memory card. Particularly, the present invention is concerned with a technique applicable effectively to an adapter for a memory card still smaller than a small-sized memory card such as a reduced-size MMC, as well as the memory card.

Such memory cards as a multi-media card (there is a standard established by Multi-Media Card Association; hereinafter referred to as MMC) and an SD card (there is a standard established by SD Card Association) are one of storage devices which store information in a semiconductor memory chip disposed in the interior thereof. In the memory cards in question, an access of information is made directly and electrically to a non-volatile memory formed in the semiconductor memory chip and thus there is no control of a mechanical system, so that the memory cards in question have such excellent characteristics as the read time being high and the replacement of a storage medium being easy in comparison with other storage devices. Besides, since the outline is relatively small-sized and light-weight, the memory cards in question are used mainly as auxiliary storage devices in devices required to be portable such as portable personal computers, portable telephones and digital cameras.

An MMC is a small-sized and light-weight memory card having a weight of 1.5 g, outline dimensions of 32 mm×24 mm and a thickness of 1.4 mm. It is provided with a thin plate-like cap of a generally quadrangular shape in plan having a largely chamfered corner portion and is also provided with a memory body fitted in a recess formed in a parts-accommodating surface. The memory body includes a wiring substrate, a semiconductor chip mounted on a main surface of the wiring substrate, and a resin sealing member for sealing the semiconductor chip. The semiconductor chip is electrically connected through wiring lines formed on the wiring substrate to plural external terminals formed on a back surface of the wiring substrate. The plural external terminals are exposed to the exterior and are connected electrically to an electronic device in which the MMC is incorporated.

A reduced-size MMC (Reduced Size MMC, hereinafter referred to as RSMMC) is a memory card (weight 0.8 g, outline dimensions 18 mm×24 mm, thickness 1.4 mm) of a size about half the size of the above MMC. An external terminal structure of the RSMMC has compatibility with the MMC and can be used as an MMC by using an adapter for a memory card.

Further, the above SD card is a memory card having a weight of 3 g, outline dimensions of 32 mm×24 mm and a thickness of 2.1 mm. It is the same in shape as the MMC though different in weight and thickness. The SD card is provided with two thin plate-like cases of a quadrangular shape in plan having a largely chamfered corner portion and is also provided with a memory body sandwiched in between the two cases. Plural apertures are formed in a back surface of one case in the SD card, plural external terminals formed on a back surface of the memory body are exposed from the apertures, and the external terminals of the SD card and an electronic device in which the SD card is incorporated are electrically connected with each other through the apertures. The foregoing MMC is also employable in most of electronic devices insofar as the electronic devices are configured so as to permit the use of the SD card.

As to the adapter for a memory card, a related description is found, for example, in Japanese Unexamined Patent Publication No. 2004-348557 (Patent Literature 1), in which there is disclosed a configuration of an adapter for converting such a small-sized memory card as RSMMC into an ordinary MMC size.

Further, for example in Japanese Unexamined Patent Publication No. 2004-133516 (Patent Literature 2) there is disclosed a configuration wherein a sealing portion which covers an IC body is provided in the exterior of such a memory card as MMC and the IC body is held firmly while being sandwiched in between a memory card case and the sealing portion.

[Patent Literature 1]
Japanese Unexamined Patent Publication No. 2004-348557

[Patent Literature 2]
Japanese Unexamined Patent Publication No. 2004-133516

SUMMARY OF THE INVENTION

Recently, with the reduction in size of electronic devices incorporated into memory cards, an extremely small-sized memory card somewhat thinner than the foregoing MMC and SD card and smaller in planar size than the RSMMC has been being commercialized. In this case, it is an important subject in what manner such an extremely small-sized memory card is to be made employable in a corresponding larger-size device such as MMC, SD card or RSMMC.

It is an object of the present invention to provide a technique which can improve the versatility of an extremely small-sized memory card.

The above and other objects and novel features of the present invention will become apparent from the following description and the accompanying drawings.

The following is an outline of typical modes of the present invention as disclosed herein.

In one aspect of the present invention there is provided an adapter for a memory card, the adapter having the same planar size as that of a memory card of a first size and having a space capable of receiving therein a memory card of a second size smaller than the first size, wherein the thickness of a region within the space of the adapter where internal terminals are disposed is made larger than that of a region of the adapter where plural external terminals are disposed.

In another aspect of the present invention there is provided a memory card comprising a semiconductor chip mounted on a first surface of a wiring substrate and having a memory circuit which contributes to the storage of information, an electronic part mounted on a second surface on the side opposite to the first surface of the wiring substrate, and a plurality of external terminals disposed on the second surface of the wiring substrate at a position spaced away from the electronic part and connected electrically to both the semiconductor chip and the electronic part, wherein the thickness of a region of the memory card where the electronic part is mounted is made larger than that of a region of the memory card where the plural external terminals are disposed.

The following is a brief description of effects obtained by the typical modes of the present invention as disclosed herein.

Since the adapter for a memory card has the same planar size as that of a memory card of a first size and has a space able to receive therein a memory card of a second size smaller than the first size and the thickness of a region within the space of the adapter where internal terminals are disposed is made larger than that of a region of the adapter where plural external terminals are disposed, a memory card of an extremely small size can be changed to a memory card of a larger size and therefore it is possible to improve the versatility of the extremely small-sized memory card.

Since the thickness of the electronic part mounted region of the memory card is made larger than that of the external terminals-disposed region of the memory card, it is possible to improve the performance of the memory card.

DETAILED DESCRIPTION OF PREFERRED EMBODIMENTS

Figure 1:
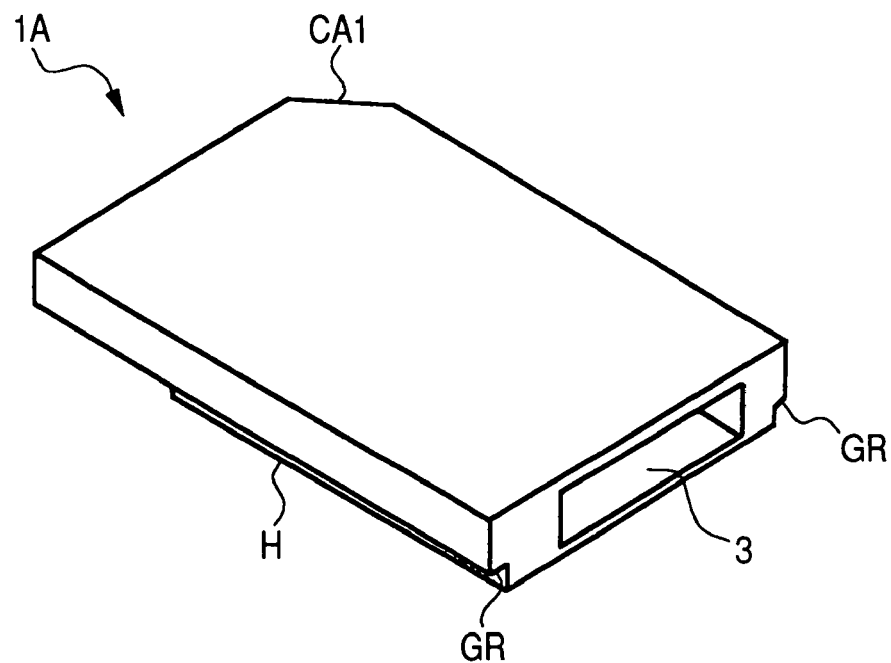
FIG. 1 is an entire perspective view of an adapter for a memory card according to an embodiment of the present invention as seen from an upper surface side.

Where required for convenience's sake, the following embodiments will each be described in a divided manner into plural sections of embodiments, but unless otherwise mentioned, they are not unrelated to each other, but are in a relation such that one is a modification or a detailed or supplementary explanation of part or the whole of the other. In the following embodiments, when reference is made to the number of elements (including the number, numerical value, quantity and range), no limitation is made to the number referred to, but numerals above and below the number referred to will do as well unless otherwise mentioned and except the case where it is basically evident that limitation is made to the number referred to. Further, it goes without saying that in the following embodiments their constituent elements (including constituent steps) are not always essential unless otherwise mentioned or in the case where they are considered obviously essential in principle. Likewise, it is to be understood that when reference is made to the shapes and positional relation of constituent elements in the following embodiments, those closely similar to or resembling such shapes, etc. are also included unless otherwise mentioned or in the case where a negative answer obviously results in principle. This is also true of the foregoing numerical value and range. Moreover, in all of the drawings for illustrating the following embodiments, portions having the same functions are identified by like reference numerals, and repeated explanations thereof will be omitted if possible. Embodiments of the present invention will be described in detail hereinunder with reference to the accompanying drawings.

First Embodiment

Figure 2:
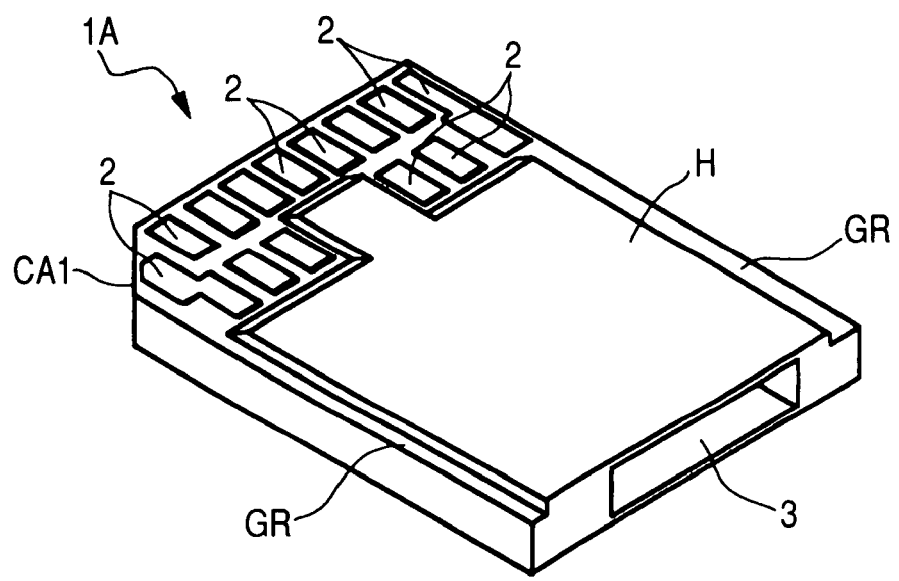
FIG. 2 is an entire perspective view of the adapter of FIG. 1 as seen from a back surface side.
Figure 3:
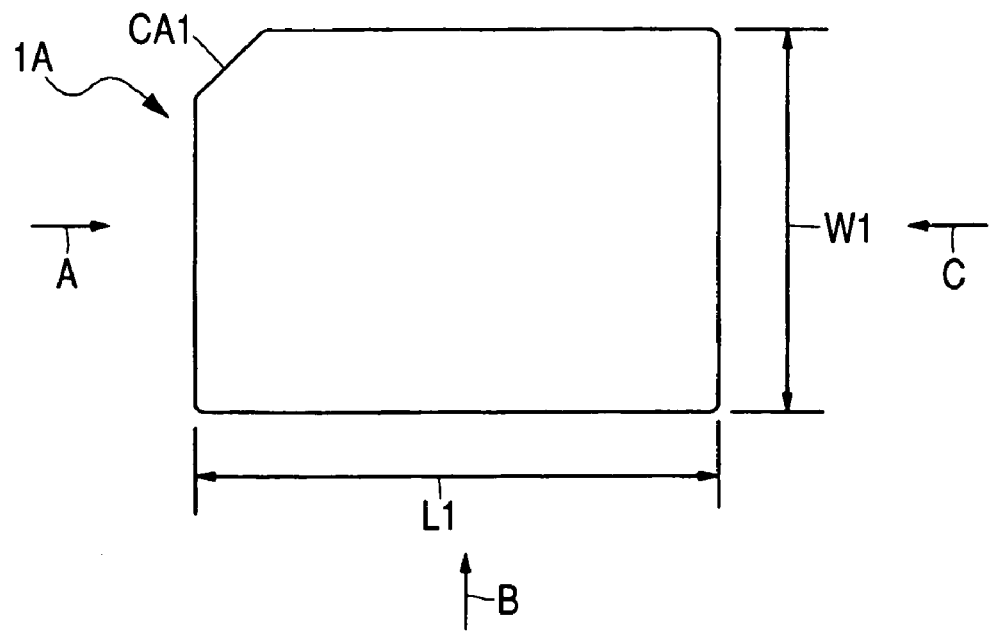
FIG. 3 is an entire plan view of the upper surface of the adapter.
Figure 4:
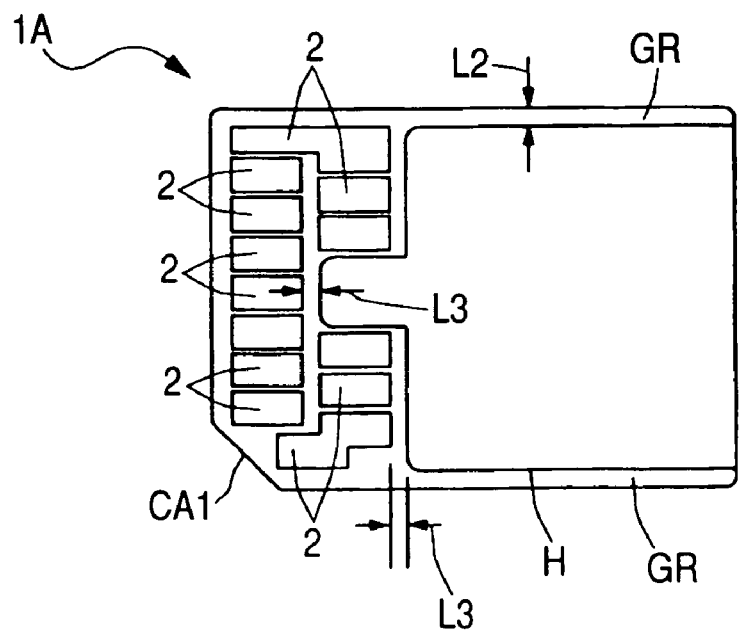
FIG. 4 is an entire plan view of the back surface of the adapter.
Figure 5:
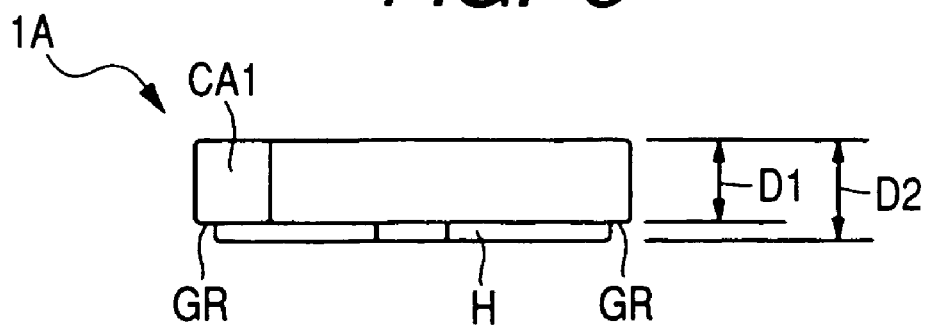
FIG. 5 is a front view of the adapter as seen in the direction of arrow A in FIG. 3.
Figure 6:
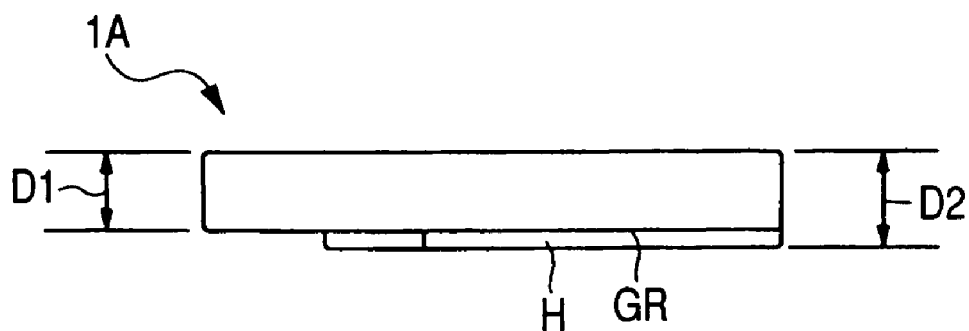
FIG. 6 is a side view of the adapter as seen in the direction of arrow B in FIG. 3.
Figure 7:
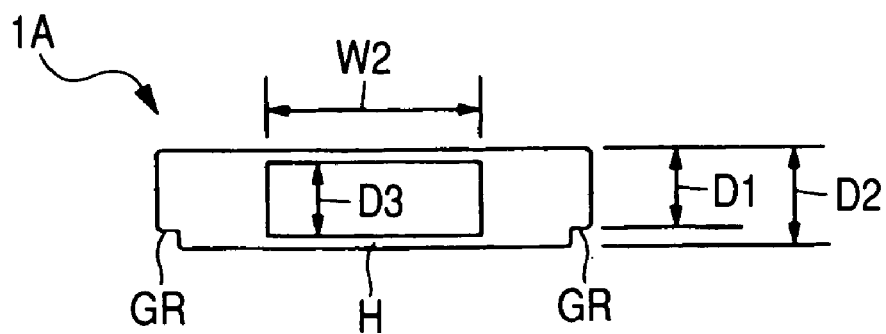
FIG. 7 is a rear view of the adapter as seen in the direction of arrow C in FIG. 3.

FIG. 1 is an entire perspective view of an adapter for a memory card according to a first embodiment of the present invention as seen from an upper surface (first surface) side, FIG. 2 is an entire perspective view of the adapter of FIG. 1 as seen from a back surface (second surface) side, FIG. 3 is an entire plan view of the upper surface of the adapter of FIG. 1, FIG. 4 is an entire plan view of the back surface of the adapter of FIG. 1, FIG. 5 is a front view of the adapter as seen in the direction of arrow A in FIG. 3, FIG. 6 is a side view of the adapter as seen in the direction of arrow B in FIG. 3, and FIG. 7 is a rear view of the adapter as seen in the direction of arrow C in FIG. 3.

An adapter for a memory card, (hereinafter referred to simply as "adapter"), 1A according to a first embodiment of the present invention is constituted, for example, by a small thin plate of a rectangular planar shape having a large chamfered portion CA1 for index formed at one corner, for example. The adapter 1A has the same planar size (standardized) as that of a full-size MMC (a memory card of a first size or IC (Integrated Circuit) card), e.g., 24 mm in width W1 and 32 mm in length L1. The adapter 1A has a card receiving space able to receive therein a memory card (a memory card of a second size or IC card) of an extremely small size to be described later which is smaller than the MMC. Illustrated is one which functions as an adapter for HS (High Speed) MMC. When the extremely small-sized memory card is received into the card receiving space of the adapter 1A, it becomes possible to use the adapter 1A as an auxiliary storage device of MMC size in any of various portable electronic devices, including information processors such as portable computers, image processors such as digital cameras, and communication devices such as portable telephones.

The size (standardized) of the thickness of the adapter 1A according to the first embodiment is different from the standard of MMC and the adapter 1A has a first portion which is relatively thin and a second portion which is relatively thick. The first portion which is relatively thin has a thickness D1 of, say, 1.4 mm equal to the ordinary thickness size (standardized) of MMC.

In the first portion which is relatively thin, a terminal region and guide rail regions GR are disposed on a back surface of the adapter 1A. In the terminal region, for example, thirteen external terminals (first external terminals) 2 are arranged in two rows in the longitudinal direction of the adapter 1A (in the longitudinal direction of the extremely small-sized memory card or in a direction of insertion of the same memory card into the adapter 1A) in an exposed state to the exterior.

The guide rail regions GR are regions retreated inwards by a length L2 (e.g., 0.8 mm or more) from side ends of the adapter 1A and corresponding to guide rail regions of MMC. That is, when installing the adapter 1A which incorporates the memory card into any of the foregoing electronic devices, guide rails for the memory card provided on the electronic device side are combined with the guide rail regions GR of the adapter 1A. If the guide rail regions GR of the adapter 1A are thick, it becomes impossible to install the adapter 1A which incorporates the memory card into the electronic device. Therefore, the guide rail regions GR are formed in the first portion which is relatively thin.

On the other hand, in the second portion relatively thicker than the first portion, there is formed a protuberant portion H somewhat protruding in a direction away from the back surface of the adapter 1A. The thickness D2 of the second portion which is relatively thick is set at, say, about 1.6 to 2.1 mm (preferably 1.6 to 1.7 mm). The protuberant portion H in the second portion which is relatively thick is formed in such a manner that an outer periphery thereof is spaced by a length of L3 away from an outer periphery of the external terminals 2. The length L3 is set to at least, say, 0.8 mm or more, preferably 1.0 mm or so, taking an overstroke into account when taking out the adapter with the memory card incorporated therein from the electronic device by a push-push method. That is, in the adapter 1A of this first embodiment, the protuberant portion H in the second portion which is relatively thick is formed up to a rear face of the adapter 1A from the position spaced by the length L3 from the outer periphery of the external terminals 2. In the illustrated example, the protuberant portion H in the second portion which is relatively thick is present not only behind (toward the rear face of the adapter 1A) the external terminals 2 arranged in the second row (rear row) from a front face side of the adapter 1A but also between the adjacent innermost external terminals 2 in the aforesaid second row (rear row).

In the rear face of the adapter 1A is formed an opening (first opening) 3 for inserting the extremely small-sized memory card from the exterior into the card receiving space formed in the interior of the adapter 1A and for taking out the memory card from the card receiving space to the exterior. The opening 3 is formed by a slot (recess) formed in the rear face of the adapter 1A. The opening 3 has a rectangular plane shape and has a width W2 of, say, about 10 to 15 mm which is larger than the width of the extremely small-sized memory card and smaller than the width W1 of the adapter 1A. Further, the opening 3 has a height D3 of, say, about 1.0 to 1.5 mm which is larger than the thickness of the extremely small-sized memory card and smaller than the thickness D2 of the adapter 1A. That is, the thickness D2 of the second portion of the adapter 1A is larger than the thickness D1 of the first portion. As will be described in detail later, the adapter 1A is formed so that the thickness of its second portion is such a thickness D2 as to cover the sum of the thickness of the memory card 5 and the height of connector lines 10, whereby a space for the memory card indicated at 5 and the connector lines 10 can be ensured within the adapter 1A.

Figure 8:
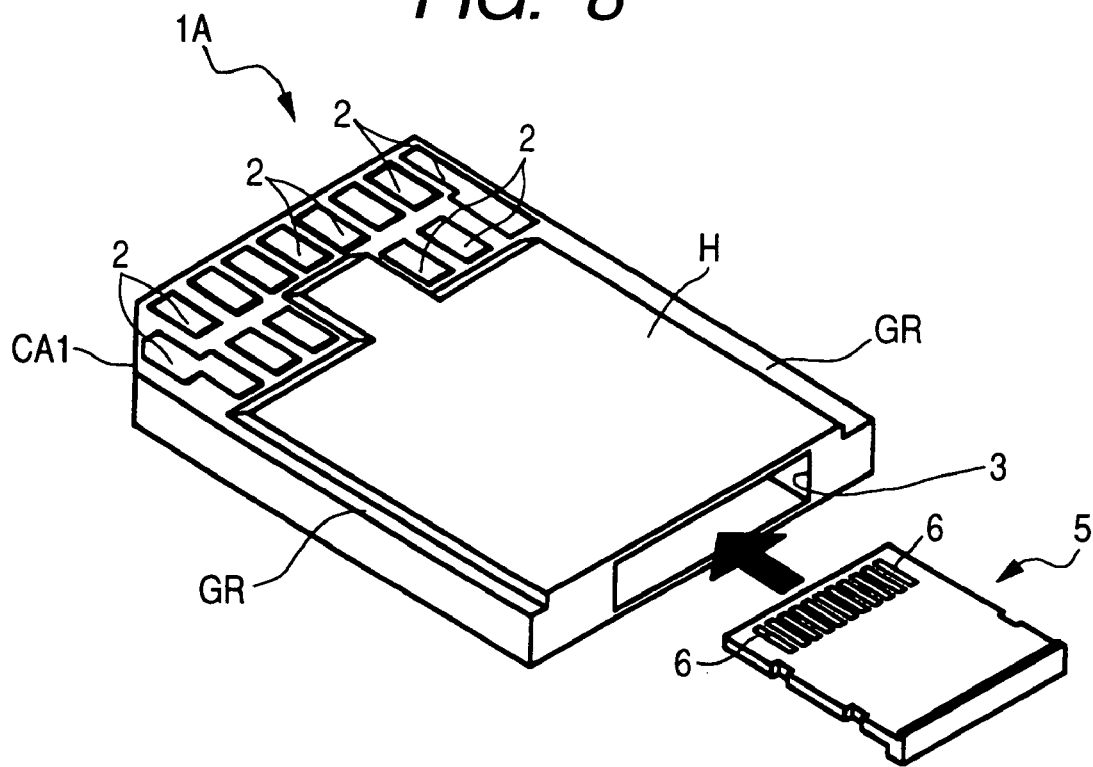
FIG. 8 is an entire perspective view of the adapter as seen from the upper surface (first surface) side in a state in which a memory card of an extremely small size is being loaded into the adapter.
Figure 9:
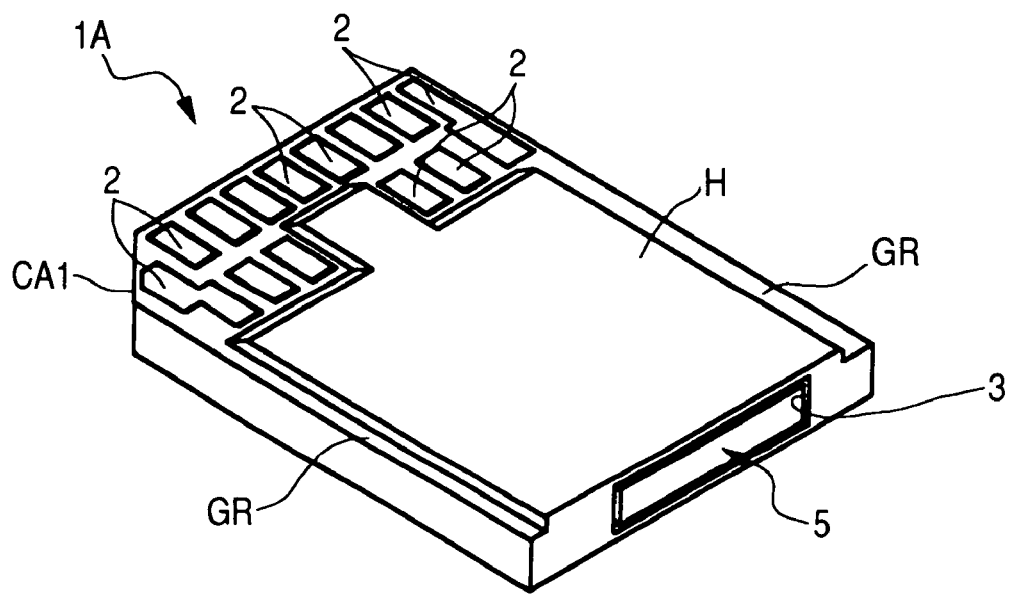
FIG. 9 is an entire perspective view of the adapter as seen from the back surface (second surface) side after loading of the extremely small-sized memory card.
Figure 10:
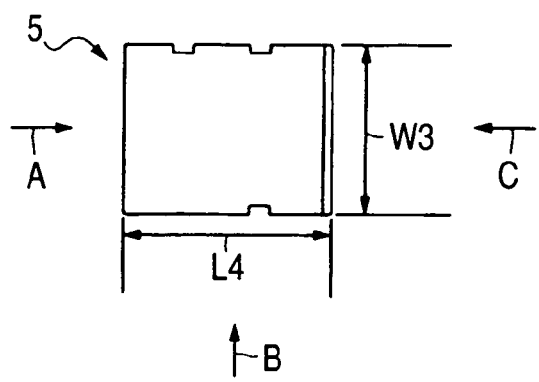
FIG. 10 is an entire plan view of an upper surface of the extremely small-sized memory card shown in FIG. 8.
Figure 11:
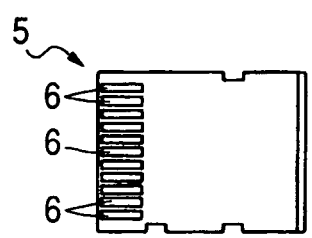
FIG. 11 is an entire plan view of a back surface of the extremely small-sized memory card shown in FIG. 10.
Figure 12:
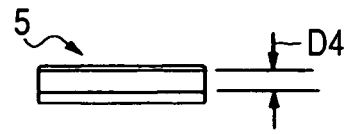
FIG. 12 is a front view of the extremely small-sized memory card as seen in the direction of arrow A in FIG. 10.
Figure 13:
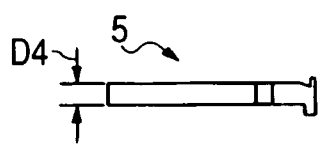
FIG. 13 is a side view of the extremely small-sized memory card as seen in the direction of arrow B in FIG. 10.
Figure 14:
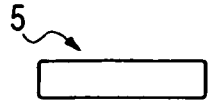
FIG. 14 is a rear view of the extremely small-sized memory card as seen in the direction of arrow C in FIG. 10.

FIG. 8 is an entire perspective view of the adapter as seen from the upper surface (first surface) side in a state in which the extremely small-sized memory card is being loaded into the adapter, FIG. 9 is an entire perspective view of the adapter as seen from the back surface (second surface) side after loading of the extremely small-sized memory card, FIG. 10 is an entire plan view of an upper surface of the extremely small-sized memory card shown in FIG. 8, FIG. 11 is an entire plan view of a back surface of the extremely small-sized memory card shown in FIG. 10, FIG. 12 is a front view of the extremely small-sized memory card as seen in the direction of arrow A in FIG. 10, FIG. 13 is a side view of the extremely small-sized memory card as seen in the direction of arrow B in FIG. 10, and FIG. 14 is a rear view of the extremely small-sized memory card as seen in the direction of arrow C in FIG. 10.

As shown in FIGS. 8 and 9, the extremely small-sized memory card 5 is received in the card receiving space of the adapter 1A through the opening 3 formed in the rear face of the adapter in a state in which plural external terminals 6 face the same direction as the plural external terminals of the adapter. The memory card 5 is smaller in outline size than the so-called RSMMC. For example, the memory card 5 has a width W3 of 11 mm, a length L4 of 14 mm which is shorter than half of the length L1 in the longitudinal direction of the adapter 1A, and a thickness D4 of about 1.0 to 1.2 mm. On a front-side back surface of the memory card 5 are formed, say, eleven external terminals (second external terminals) 6 in one row in an exposed state to the exterior.

Figure 15:
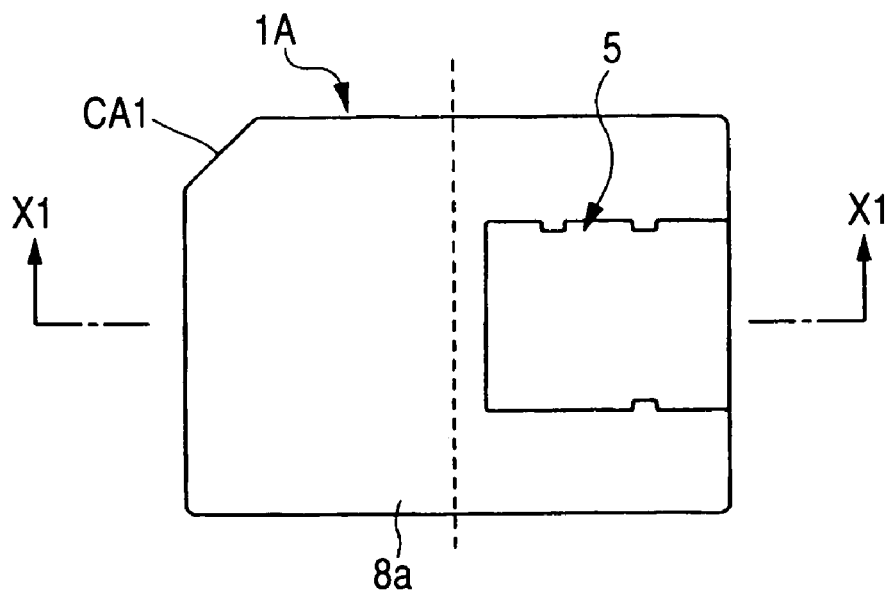
FIG. 15 is an entire plan view of the upper surface of the adapter after loading of the extremely small-sized memory card.
Figure 16:
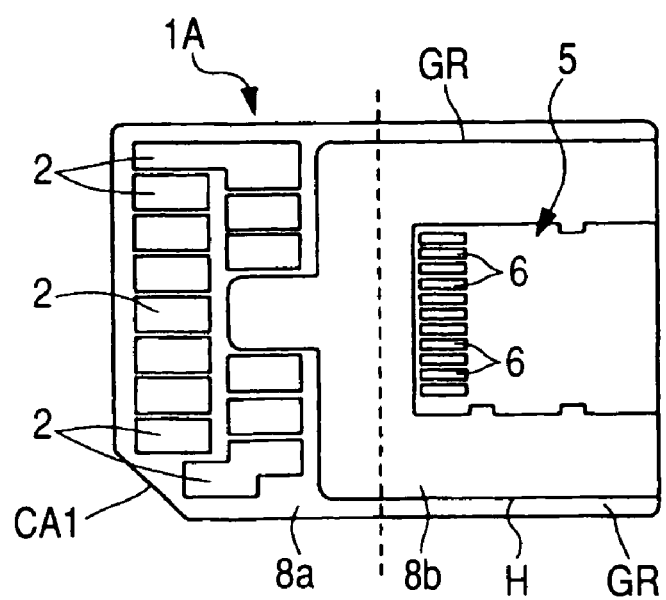
FIG. 16 is an entire plan view of the back surface of the adapter after loading of the extremely small-sized memory card.
Figure 17:
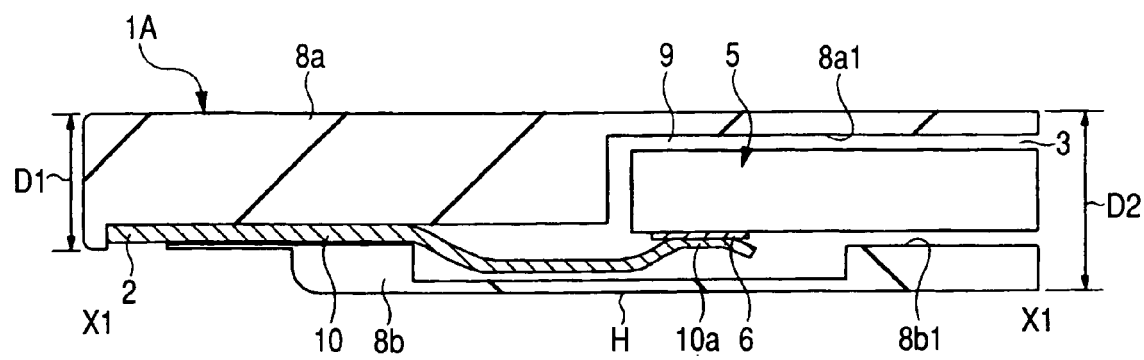
FIG. 17 is a sectional view taken on line X1-X1 in FIG. 15.

FIG. 15 is an entire plan view of the upper surface of the adapter after loading of the extremely small-sized memory card, FIG. 16 is an entire plan view of the back surface of the adapter after loading of the extremely small-sized memory card, and FIG. 17 is a sectional view taken on line X1-X1 in FIG. 15. In FIGS. 15 and 16, the memory card 5 present within the adapter 1A is shown in a see-through state. Broken lines shown in FIGS. 15 and 16 each represent the center in the longitudinal direction of the adapter 1A (in the longitudinal direction of the memory card 5, i.e., in the direction of insertion of the memory card 5 into the adapter 1A).

The adapter 1A includes a first case (first housing) 8a on the upper surface side of the adapter 1A and a second case (second housing) 8b on the back side of the adapter. The first case 8a has an upper surface (first surface) and a back surface (second surface) which are positioned on mutually opposite sides in the thickness direction of the adapter 1A. On the back surface of the first case 8a, not only the plural external terminals 2 are disposed, but also the second case 8b is joined to the back surface by a thermosonic wire bonding method for example.

As shown in FIG. 17, the portion of the first case 8a alone in the adapter 1A is the first portion as a relatively thin portion having the thickness D1, while the joined portion between the first and second cases 8a, 8b is the second portion as a relatively thick portion having the thickness D2. That is, the second case 8b forms the projecting portion H. Concave portions 8a1 and 8b1 formed respectively in opposed surfaces of the first and second cases 8a, 8b overlap each other in the joined portion between the first and second cases, whereby the card receiving space 9 is formed. The card receiving space 9 is positioned centrally in the width direction (transverse direction) of the adapter 1A. That is, vacant regions are present right and left of the card receiving space 9.

From the standpoint of, for example, attaining the reduction of weight, easiness of machining and flexibility, the first and second cases 8a, 8b are formed of a thermoplastic resin such as, for example, polycarbonate, ABS (acrylonitrile butadiene styrene resin, PBT (polybutylene terephthalate, PPE (polyphenylene ether), nylon, LCP (liquid crystal polymer), PET (polyethylene terephthalate), or a mixture thereof. The first and second cases 8a, 8b may each be formed by plural blocks. In this case, all of the plural blocks may be formed of resin, but a thin block portion may be formed of metal. By so doing it is possible to improve the mechanical strength of the thin adapter 1A.

Each of the external terminals 2 is connected electrically to one end of the associated connector line (wiring line) 10. Opposite ends of the connector lines 10 extend into the card receiving space 9 and are electrically connected to internal terminals 10a which are integrally formed at extending ends of the connector lines 10. The internal terminals 10a are disposed within the card receiving space 9 so as to become electrically connected to the external terminals 6 of the memory card 5 upon insertion of the memory card into the card receiving space 9. The connections between the connector lines 10 and the internal terminals 10a are formed in a curved shape so as to operate as plate springs. With the curved connections, when the memory card 5 is inserted into the card receiving space 9, the internal terminals 10a are urged toward the external terminals 6 of the memory card 5, press the external terminals 6 and come into contact firmly with the external terminals 6.

Figure 18:
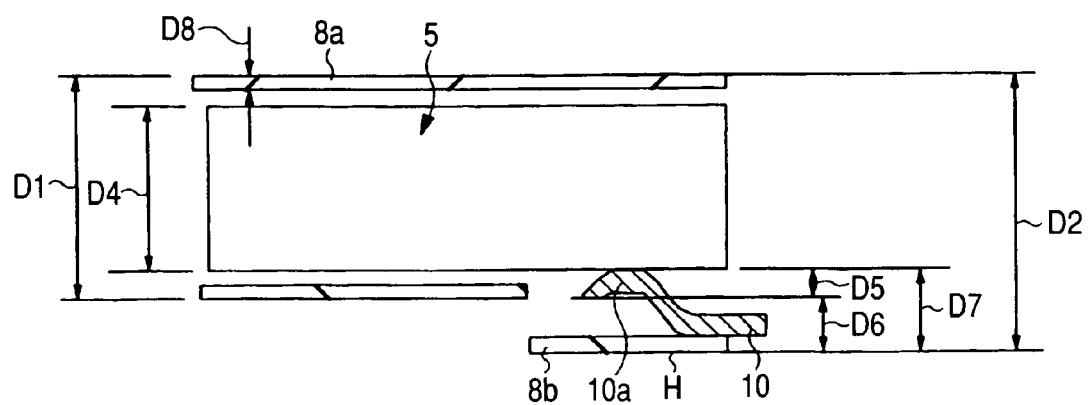
FIG. 18 is an explanatory diagram of dimensions in the thickness direction of the adapter.

FIG. 18 is an explanatory diagram of dimensions in the thickness direction of the adapter 1A.

The present inventors have studied fabrication of an adapter which permits a change in size of the extremely small-sized memory card 5 into the MMC size. As described above, the thickness of MMC is 1.4 mm, while that of the memory card 5 is about 1.0 to 1.2 mm, therefore, it follows that there remains only about 0.2 to 0.4 mm as the difference between both thicknesses. Assuming that the adapter is required to have a case thickness of at least 0.1 mm, the total thickness of upper and lower cases in the adapter thickness direction is 0.2 mm, thus giving rise to the problem that a portion for disposing the internal terminals 10a cannot be ensured within the adapter.

In this first embodiment, therefore, the adapter 1A is formed with a second portion thicker than the first portion whose thickness is equal to the thickness of MMC, as noted above. More specifically, in the adapter 1A, the thickness of at least the region where the internal terminals 10a are disposed is made larger than the thickness of the region where the plural external terminals 2 are disposed. As a result, a portion where the internal terminals 10a are to be disposed can be ensured within the adapter 10a and hence it is possible to provide the adapter 1A which permits a change of the extremely small-sized memory card 5 to MMC. That, since the extremely small-sized memory card 5 can be changed to the larger MMC by inserting it into the adapter 1A, it is possible to improve the versatility of the memory card 5.

If a projection height D5 of each internal terminal 10a is, say, about 0.1 mm and a height D6 necessary for constituting the plate spring of each connector line 10 is, say, about 0.2 to 0.3 mm, a height (thickness of the second case 8b or the height of the protuberant portion H) D7 necessary for installation of the internal terminals 10a is equal to height D5+height D6 and is therefore, say, about 0.3 to 0.4 mm. Given that the thickness D8 of the first case 8a is 0.1 mm, the thickness D2 of the thick, second portion of the adapter 1A becomes equal to the thickness D4 (1.2 mm) of the extremely small-sized memory card 5+height D7+thickness D8 and is, say, about 1.6 to 1.7 mm. Since the socket of the electronic device for insertion therein of MMC has such dimensions as permit insertion therein of SD card (thickness 2.1 mm), an upper limit of the thickness D2 of the thick, second portion in the adapter 1A is, say, 2.1 mm. That is, the thickness D2 of the thick, second portion is, say, 1.6 to 2.1 mm. Or, the height (thickness of the second case 8b or the height of the protuberant portion H) D7 necessary for installation of the internal terminals 10a is, say, 0.3 to 0.7 mm.

Second Embodiment

Figure 19:
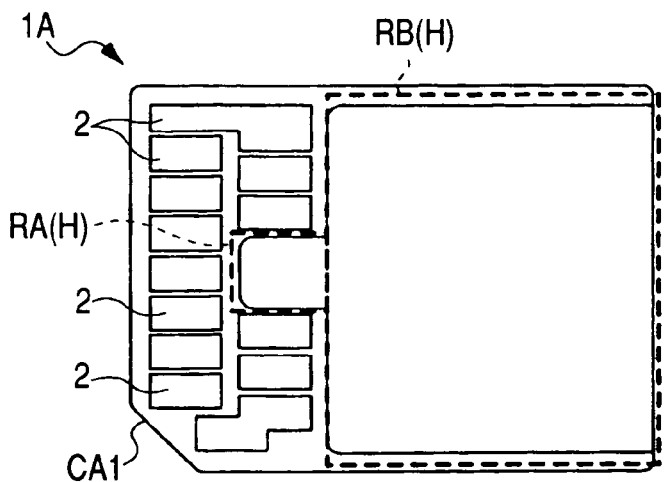
FIG. 19 is an entire plan view of the back surface of the adapter shown in FIG. 1.
Figure 20:
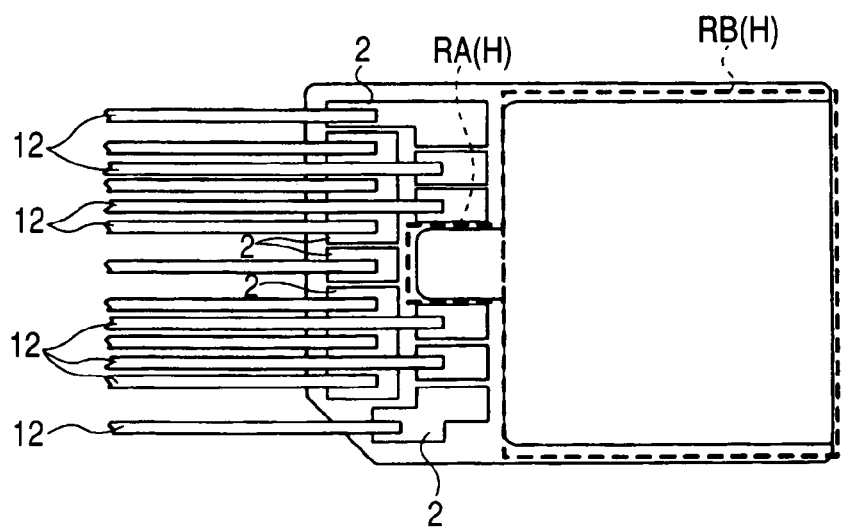
FIG. 20 is an entire plan view showing an example of an inserted state of the adapter of FIG. 1 into a socket of an electronic device.
Figure 21:
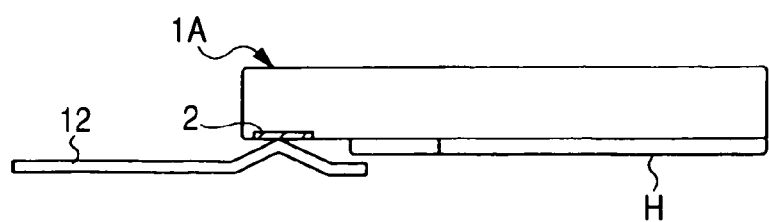
FIG. 21 is a side view of the adapter shown in FIG. 20.
Figure 22:
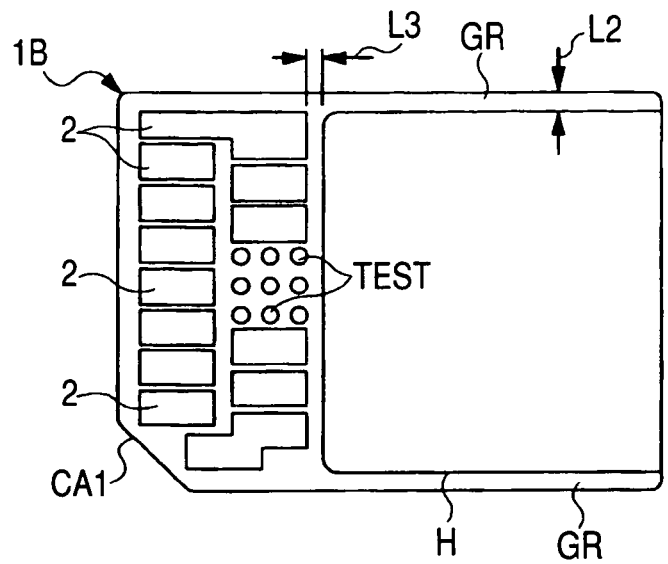
FIG. 22 is an entire plan view of a back surface of an adapter for a memory card according to another embodiment of the present invention.
Figure 23:
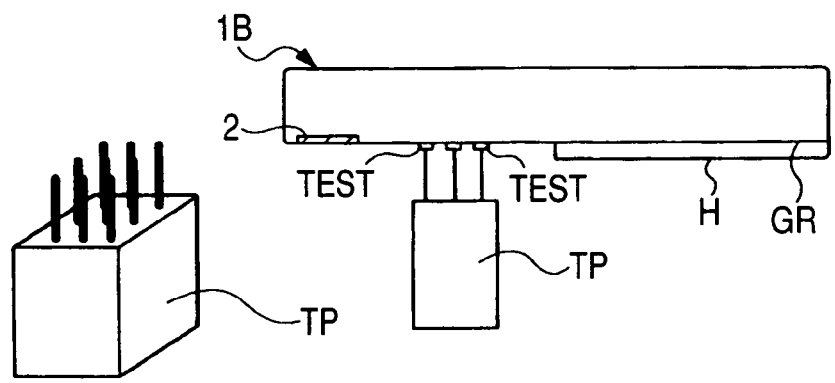
FIG. 23 is an explanatory diagram of a test work performed in a state in which a memory card is incorporated into the adapter of FIG. 22.
Figure 24:
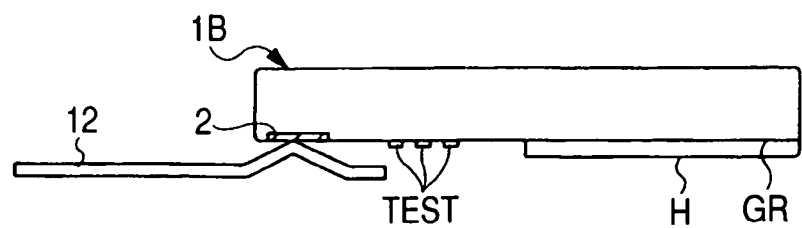
FIG. 24 is a side view of the adapter shown in FIG. 23.

FIG. 19 is an entire plan view of the back surface of the adapter of the previous first embodiment, FIG. 20 is an entire plan view showing an example of an inserted state of the memory card-incorporated adapter into a socket of an electronic device, FIG. 21 is a side view of the adapter shown in FIG. 20, FIG. 22 is an entire plan view of a back surface of an adapter according to a second embodiment of the present invention, FIG. 23 is a diagram showing a state in which a memory card is being tested in an inserted condition thereof into the adapter shown in FIG. 22, and FIG. 24 is a side view showing an example in which the adapter of FIG. 22 with the memory card incorporated therein is installed into a socket of an electronic device.

The protuberant portion H described in the first embodiment has a convex shape in plan constituted by a front-side region RA and a rear-side region RB of the adapter 1A, as shown in FIG. 19. In this second embodiment, reference will be made to a case where the projecting portion has a generally quadrangular shape in plan with the front-side region RA omitted.

FIGS. 20 and 21 illustrate an inserted state of the adapter 1A of FIG. 19 into a socket of an electronic device. As shown in FIG. 20, terminals 12 disposed within the socket of the electronic device extend from the front to the rear side of the adapter 1A and come into contact with external terminals 2 of the adapter. FIG. 21 is a sectional view (side view) of FIG. 20, illustrating an inserted state of the adapter 1A into the socket of the electronic device. As shown in these figures, it is seen that the front region RA of the adapter 1A can be omitted.

FIG. 22 illustrates a case where the front side of the adapter 1A is omitted. As to a protuberant portion H, it is of the same structure as that in the first embodiment with respect to the rear side of the adapter 1A and is present on only the rear side from the second row of external terminals 2. That is, the protuberant portion H is not formed in the first and second rows of external terminals 2. According to this structure, since the shape of the protuberant portion H is simple, it becomes possible to simplify the manufacturing process for the adapter 1A.

The present inventors have made a study about a configuration which permits the execution of a test work without taking out the memory card 5 from the adapter 1A in the event of malfunction of the memory card 5. In more particular terms, the present inventors have made a study about an adapter structure which permits the execution of a test work using an existing test device for MMC in an inserted state of the memory card into the adapter 1A on the assumption that the test cannot be performed by the existing test device in case of a change of the memory card 5 into an extremely small-sized one.

In FIG. 22, plural test terminals TEST are provided in a space formed by omission of the front-side region RA of the adapter 1A. The plural test terminals TEST are each formed at a position spaced a distance L3 from the first and second rows of external terminals 2 so as to avoid contact thereof with the external terminals 2. Thus, the test terminals TEST are spaced away from the external terminals lest they should contact the external terminals.

For distinction from the external terminals 12, each test terminal TEST is formed smaller in size than the external terminals 12 and is formed in a different shape from the shape of the external terminals. As to the layout of the test terminals TEST, although in the illustrated example the test terminals TEST are arranged at equal intervals in both the direction of insertion of the memory card 5 and a direction orthogonal to the card inserting direction, no limitation is made thereto. For example, they may be arranged in a zigzag fashion. In this case, it becomes possible to arrange a larger number of test terminals TEST than in the equally spaced layout. Further, although in the illustrated example the test terminals TEST are formed in a circular shape, no limitation is made thereto. For example, they may be formed in a semicircular, elliptic or polygonal shape.

The plural test terminals TEST are electrically connected (not shown) to the memory card 5 present within the adapter 1A, so in the event a controller chip mounted within the memory card 5 should become inoperable due to electrostatic breakdown for example, it is possible to make a direct access control for a non-volatile memory chip from the exterior through the test terminals if there remain data in the non-volatile memory chip. FIG. 23 shows a state in which a test is being conducted by applying an existing test device to the test terminals TEST. Although in the drawing a test probe is shown in a simplified form as the existing test device, no limitation is made thereto. Various other existing test devices are employable.

Thus, in this embodiment the manufacturing process can be simplified by omitting the front-side region RA of the adapter 1A. Moreover, since the plural test terminals TEST are provided in the space formed by omission of the front-side region RA, it is possible to conduct a test work for the memory card 5 with use of an existing test device.

Third Embodiment

Figure 25:
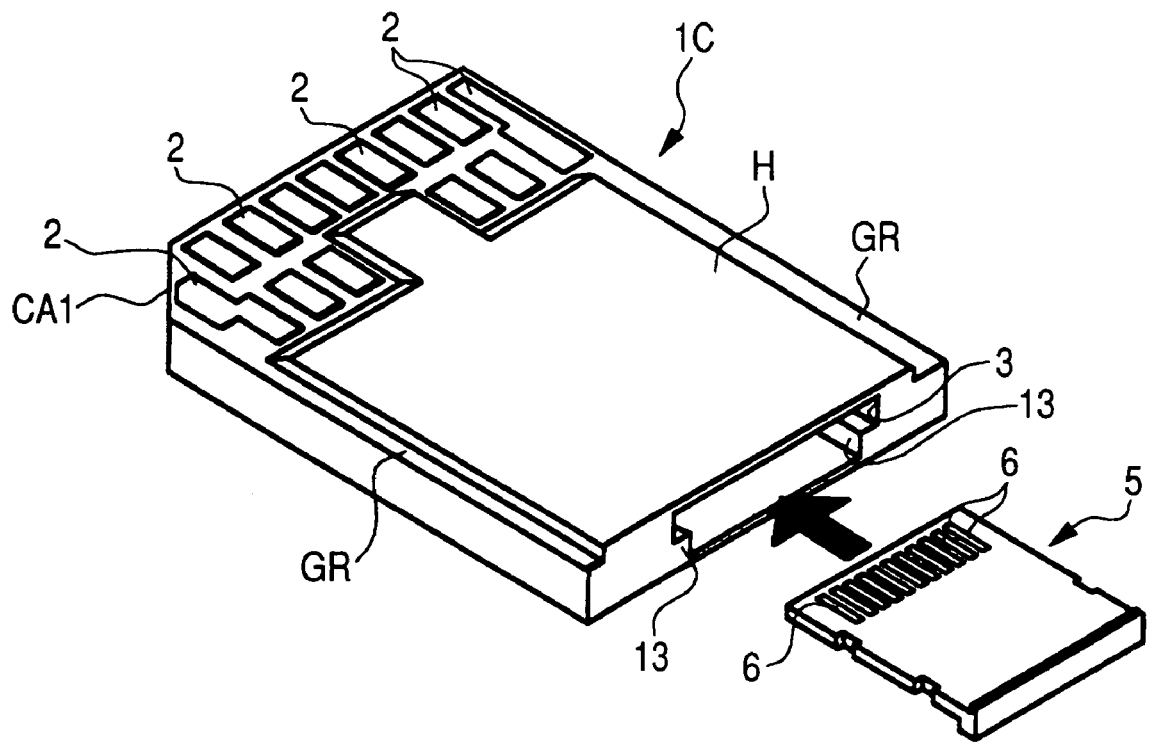
FIG. 25 is an entire perspective view of an adapter for a memory card according to a further embodiment of the present invention as seen from a back surface side.
Figure 26:
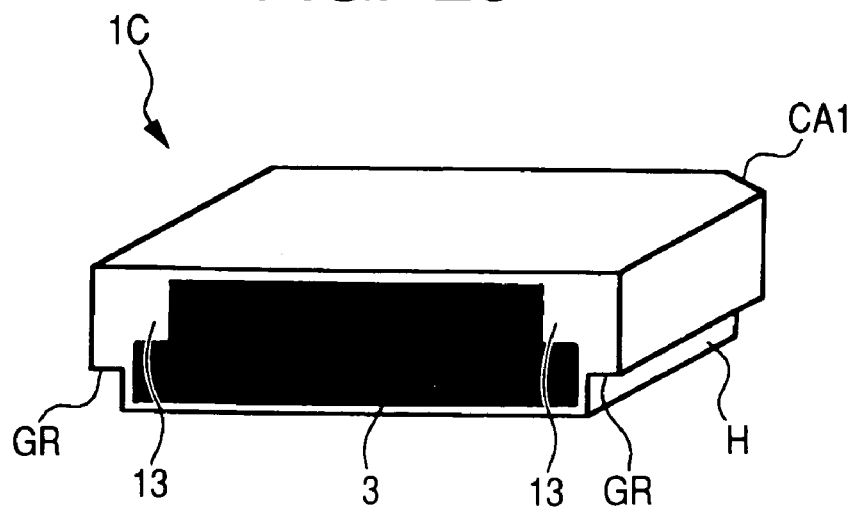
FIG. 26 is an entire perspective view of the adapter of FIG. 25 as seen from a rear side.

FIG. 25 is an entire perspective view of an adapter according to a third embodiment of the present invention as seen from a back surface side and FIG. 26 is an entire perspective view of the adapter as seen from a rear side.

In this third embodiment, guide portions 13 are formed along both inner side faces of an opening 3 and a card receiving space 9 in an adapter 1C. The guide portions 13 extend from the opening 3 toward the card receiving space 9 and have not only a function of assisting a horizontal movement of the memory card 5 at the time of inserting or taking out the memory card into or from the card receiving space but also a function of preventing insertion in an erroneous direction (reverse insertion) of the memory card 5. Other constructional points of the adapter 1C are common to the adapter 1A of the first embodiment. In this third embodiment, the opening 3 of the adapter 1C is formed in a polygonal shape in plan. In the example shown in FIGS. 25 and 26, the opening 3 is formed so as to have a region different in width in a direction orthogonal to the direction of insertion of the memory card 5. More specifically, the opening 3 is formed so that the width thereof on the back surface side of the adapter 1C is longer than that on the upper surface side of the adapter.

According to this third embodiment, since the opening 3 has the above structure and the guide portions 13 are provided, it is possible to prevent reverse insertion of the memory card 5 and hence possible to prevent damage and deterioration of internal terminals 10a and connector lines 10 within the adapter 1C which are caused by the reverse insertion.

Of course, the contents of this third embodiment may be combined with the previous second embodiment. In this case, it is possible to obtain the respective effects of both embodiments.

Fourth Embodiment

Figure 27:
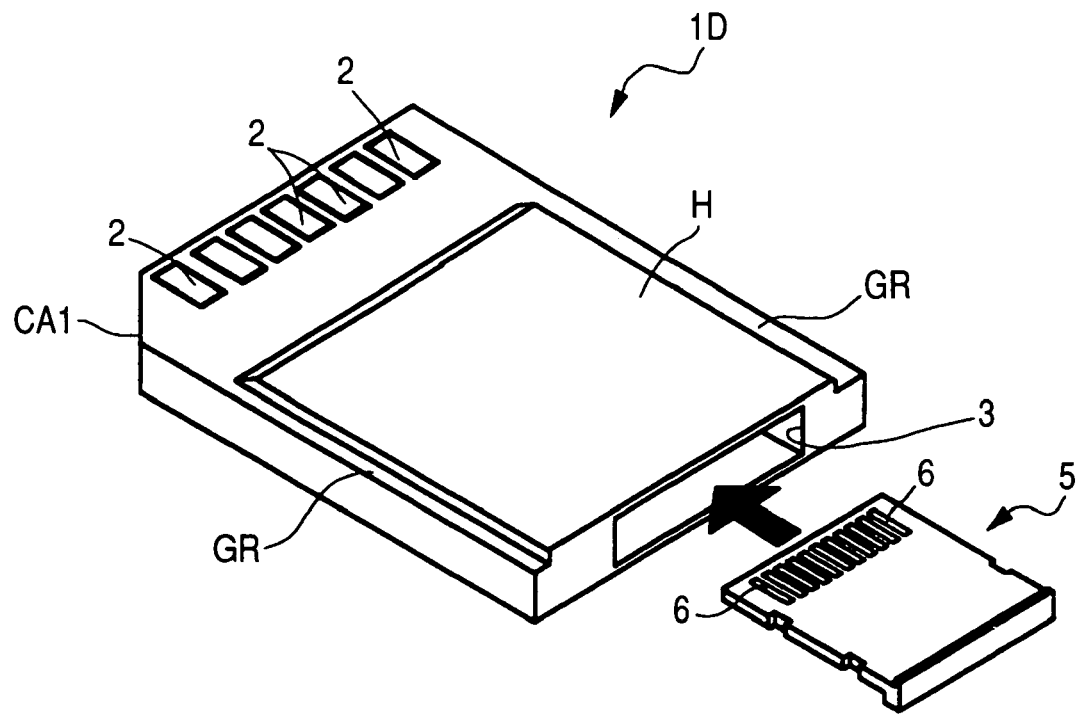
FIG. 27 is an entire perspective view of an adapter for a memory card according to a still further embodiment of the present invention as seen from a back surface side.
Figure 28:
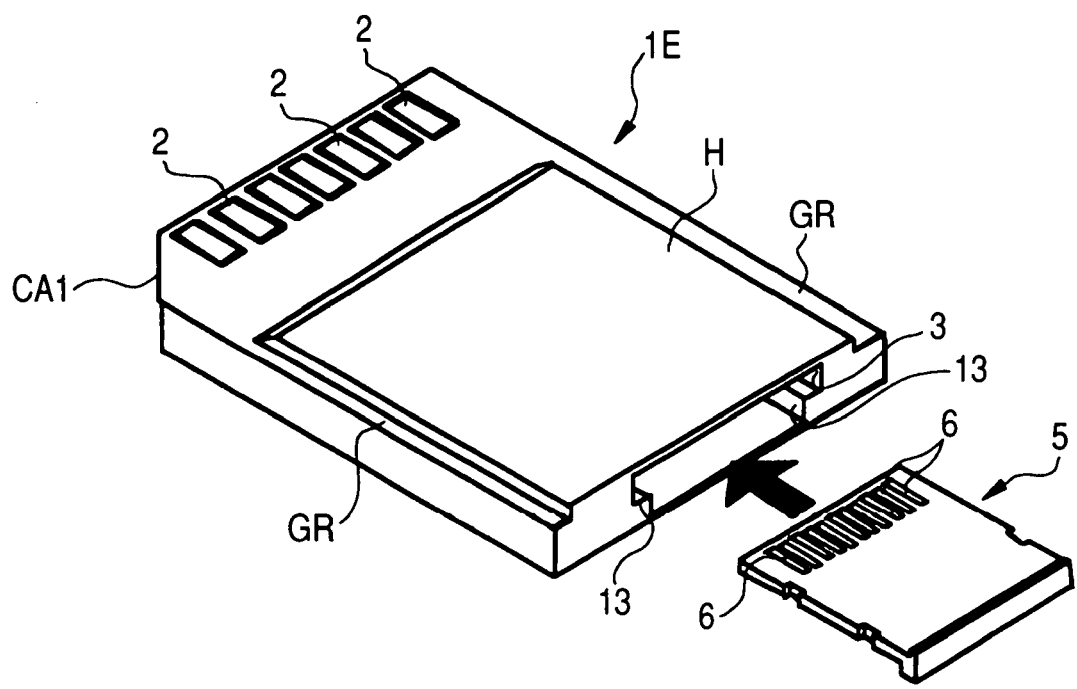
FIG. 28 is an entire perspective view of an adapter for a memory card as seen from a back surface side which adapter is a modification of the adapter of FIG. 27.

FIG. 27 is an entire perspective view of an adapter according to a fourth embodiment of the present invention as seen from a back surface side and FIG. 28 is an entire perspective view of an adapter as seen from a back surface side which adapter is a modification of the adapter of FIG. 27.

In this fourth embodiment a description will be given about adapters 1D and 1E for the ordinary MMC which is not for HSMMC. For example, seven external terminals 2 are arranged in one row on a front back side of each of the adapters 1D and 1E. In the second portion which is relatively thick, a protuberant portion H is formed over a rear face of each of the adapter 1D and 1E from a position which is spaced away by the length L3 from a position corresponding to the second row in the case of the external terminals 2 being arranged in two rows. Other constructional points are the same as those described above in the first to third embodiments. FIG. 27 shows an example in which the guide rails 13 are not formed, while FIG. 28 shows an example in which the guide rails 13 are formed. In the latter case it is possible to obtain the same effects as in the third embodiment.

Fifth Embodiment

Figure 29:
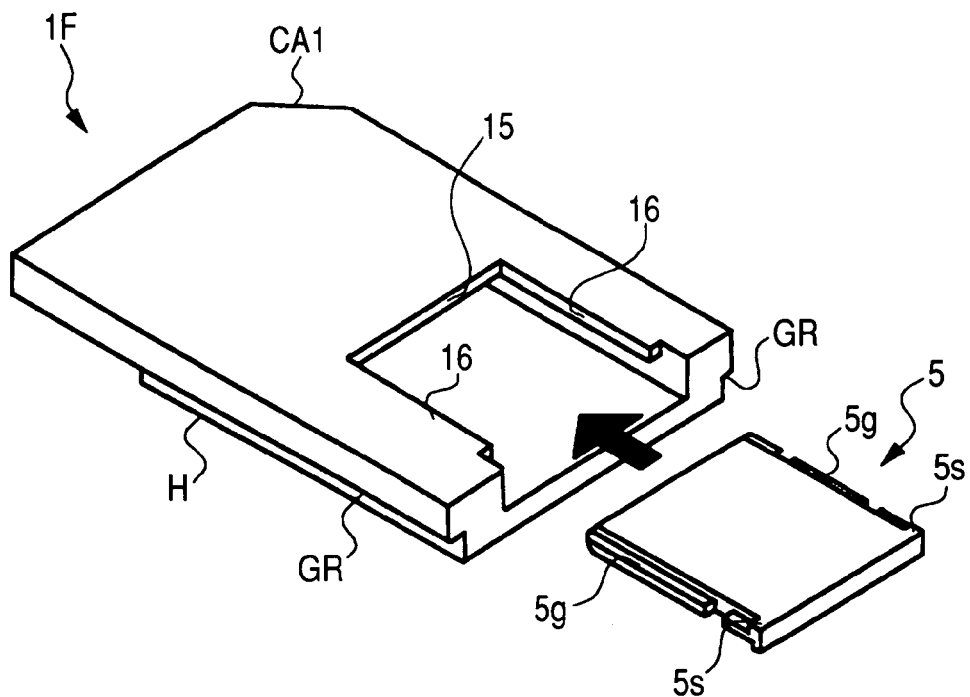
FIG. 29 is an entire perspective view of an adapter for a memory card according to a still further embodiment of the present invention as seen from an upper surface side.
Figure 30:
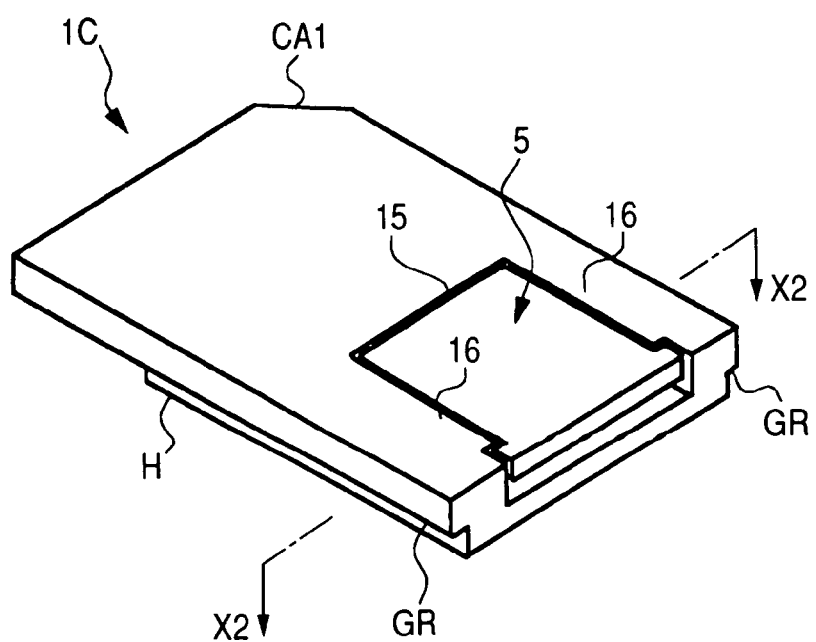
FIG. 30 is an entire perspective view of the adapter of FIG. 29 as seen from the upper surface side after loading of a memory card thereto.
Figure 31:
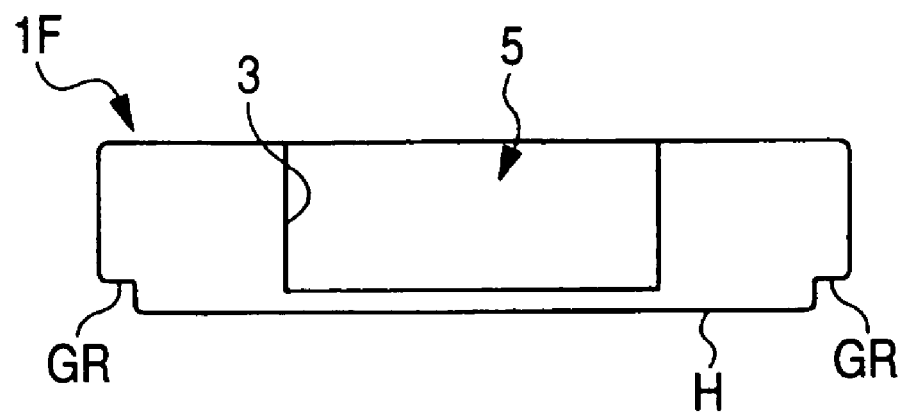
FIG. 31 is a rear view thereof.
Figure 32:
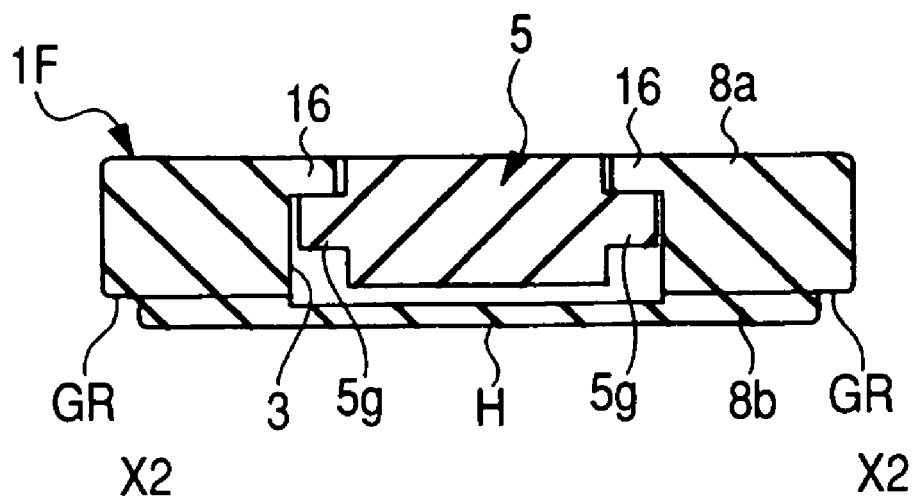
FIG. 32 is a sectional view taken on line X2-X2 in FIG. 30.

FIG. 29 is an entire perspective view of an adapter according to a fifth embodiment of the present invention as seen from an upper surface side, FIG. 30 is an entire perspective view of the adapter of FIG. 29 as seen from the upper surface side after loading of a memory card thereto, FIG. 31 is a rear view of the adapter of FIG. 30, and FIG. 32 is a sectional view taken on line X2-X2 in FIG. 30.

In this fifth embodiment, an opening (second opening) 15 extending from the opening 3 toward the card receiving space 9 is formed in an upper surface of the adapter 1F. As in the first and second embodiments, the opening 15 is formed by a slot (recess) formed in an upper surface of the adapter 1F.

Guide portions 16 are provided at upper positions of both inner side faces of the opening 15. The guide portions 16 are formed along side faces of the slot which forms the opening 15 and are constituted by protruding portions (convex portions) protruding from the side faces. The protruding portions are formed at positions closer to the upper surface side of the adapter 1F rather than the bottom side of the slot.

The guide portions 16 have not only a function of assisting a horizontal movement of the memory card 5 at the time of inserting or taking out the memory card into or from the card receiving space 9 and a function of preventing reverse insertion of the memory card 5 but also a function of pressing the memory card 5 to prevent the card from moving out of the card receiving space 9. In this case, as shown in FIG. 30, when the memory card 5 is received into the card receiving space 9 of the adapter 1F, the upper surface of the memory card assumes an exposed state to the exterior.

The guide portions 16 extend continuously from the rear to the front side of the adapter 1F. Also on side faces of the memory card 5 there are formed guide portions 5g as portions corresponding to the guide portions 16. Further formed on the side faces of the memory card 5 are stopper portions 5s for stopping movement of the memory card 5 upon insertion of the card into the adapter 1F. Other constructional points are the same as in the first to fourth embodiments. The guide portions 5g and the stopper portions 5s are formed on side faces of the memory card 5 and are constituted by protruding portions (convex portions) protruding from the side faces. The guide portions 5g extend from the front face (a face orthogonal to the direction of insertion of the memory card 5 into the adapter 1F) of the memory card 5 toward the rear face of the card. The protruding portions do not extend up to the rear face of the memory card 5 and thus the stopper portions 5s are free of the protruding portions in the vicinity of the rear face of the memory card 5.

With such a configuration of the memory card 5, as shown in FIG. 32, the memory card 5 can be disposed upward by an amount corresponding to an upper surface portion of a first case 8a of the adapter 1F. That is, a thickness corresponding to the thickness of the upper surface portion of the first case 8a can be subtracted from the thickness of the memory card 5, so that the thickness D2 of a relatively thick, second portion of the adapter 1F can be made smaller than in the first to fourth embodiments.

In the case of a configuration wherein only the rear side portion of the memory card 5 is exposed, there sometimes is a case where it is difficult to take out the memory card 5 because of a small size of the memory card. On the other hand, in this fifth embodiment, the memory card 5 can be taken out easily because the upper surface of the memory card 5 received in the card receiving space 9 of the adapter 1F is also exposed to the exterior.

Sixth Embodiment

Figure 33:
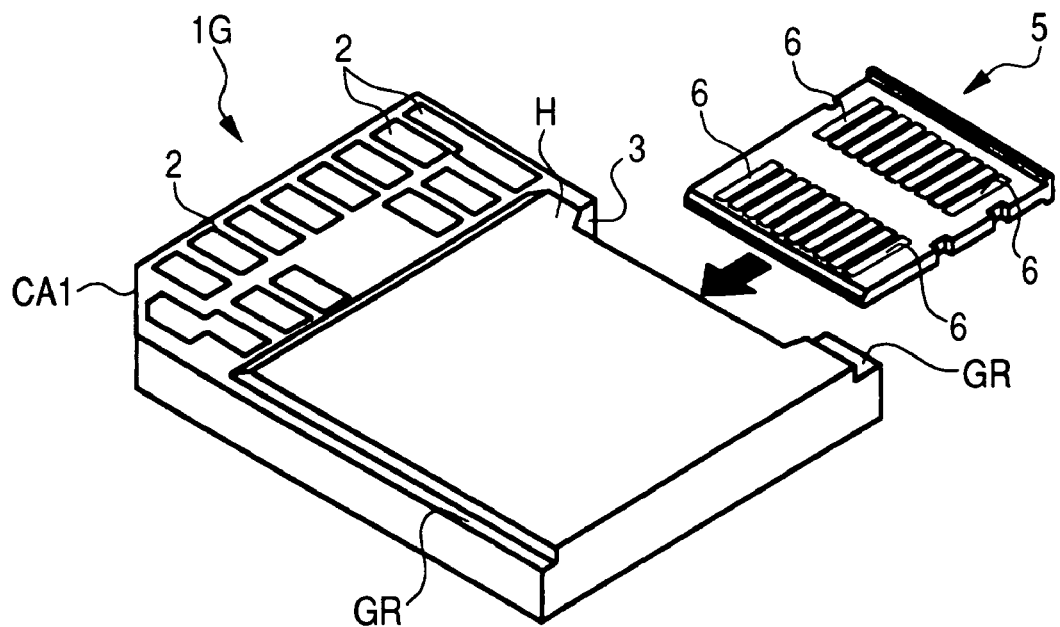
FIG. 33 is an entire perspective view of a memory card according to a still further embodiment of the present invention as seen from a back surface side.
Figure 34:
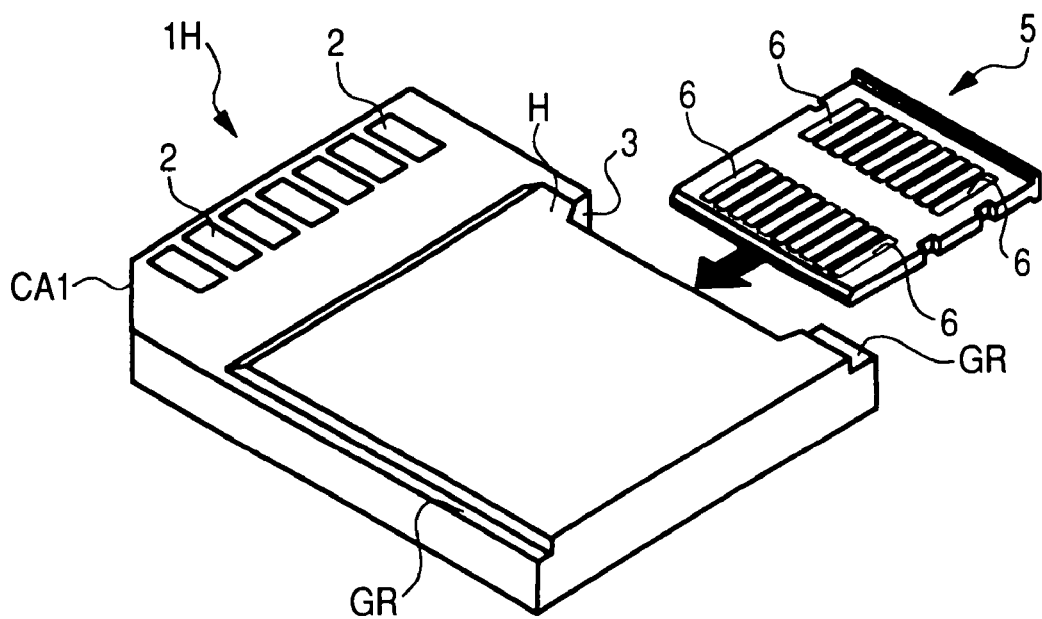
FIG. 34 is an entire perspective view of an adapter for a memory card as seen from a back side of which adapter is a modification of the adapter of FIG. 33.
Figure 35:
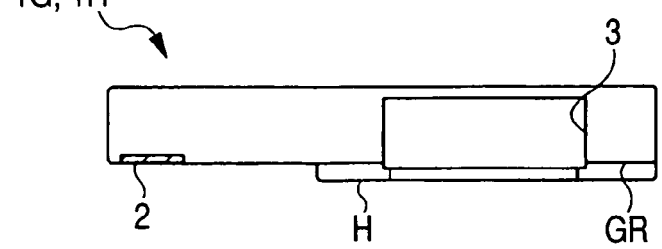
FIG. 35 is a side view on a memory card insertion side of the adapters of FIGS. 33 and 34.
Figure 36:
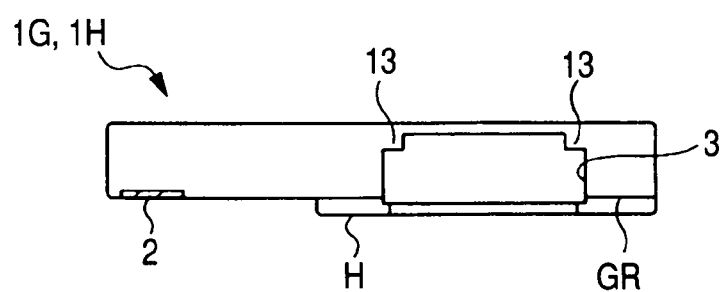
FIG. 36 is a side view on a memory card insertion side of the adapters according to a modification of FIG. 35.
Figure 37:
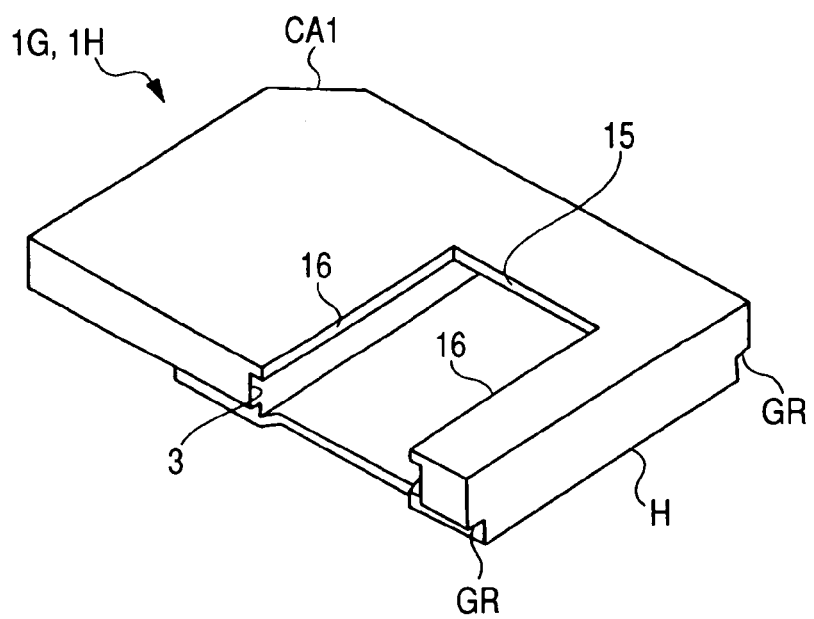
FIG. 37 is an entire perspective view of an adapter for a memory card as seen from an upper surface side which adapter is a modification of the adapters of FIGS. 33 and 34.

FIG. 33 is an entire perspective view of an adapter according to a sixth embodiment of the present invention as seen from a back surface side thereof, FIG. 34 is an entire perspective view of an adapter as seen from a back surface side which adapter is a modification of the adapter of FIG. 33, FIG. 35 is a side view on a memory card insertion side of the adapters of FIGS. 33 and 34, FIG. 36 is a side view on a memory card insertion side of the adapters according to a modification of FIG. 35, and FIG. 37 is an entire perspective view of an adapter as seen from an upper surface side which adapter is a modification of the adapters of FIGS. 33 and 34.

In this sixth embodiment, an opening 3 for inserting and taking out the memory card 5 into and from the card receiving space 9 is formed in a side face of each of adapters 1G and 1H.

In the case where an opening 3 is formed in a rear face of an adapter, the rear face of the adapter is exposed from a card take-out opening of the associated electronic device and the rear face of the memory card 5 is also in an exposed state, so there is a fear that the memory card 5 may be pulled out by mistake.

In this sixth embodiment, the opening 3 is formed in a side face of each of the adapters 1G and 1H, so even if the rear face of each of the adapters 1G and 1H is exposed from the card take-out opening formed on the associated electronic device side, there is no fear of the memory card 5 being pulled out by mistake, because the rear face of the memory card 5 is not exposed.

FIG. 33 shows an example of an adapter for HSMMC having thirteen external terminals and FIG. 34 shows an example of an adapter for the ordinary MMC having seven external terminals 2. In FIGS. 33 and 34 there is illustrated a memory card 5 in which, say, twenty external terminals 6 are arranged in two rows. FIG. 35 shows an example an opening 3 free of guide portions, while FIG. 36 shows an example of an opening 3 having guide portions 13. The openings 3 are each formed by a slot (recess) formed in a side face of each of the adapters 1G and 1H. As to the adapter 1G, as shown in FIG. 35, its sectional and planar shapes are the same as in the first embodiment. As to the adapter 1H, as shown in FIG. 36, its sectional and planar shapes are the same as in the third embodiment. With the guide portions, it is possible to obtain the same effects as in the third embodiment. Further, FIG. 37 shows an example in which an opening 15 is formed in an upper surface of each of the adapters 1G and 1H as in the fifth embodiment. In this case, it is possible to obtain the same effects as in the fifth embodiment.

Seventh Embodiment

Figure 38:
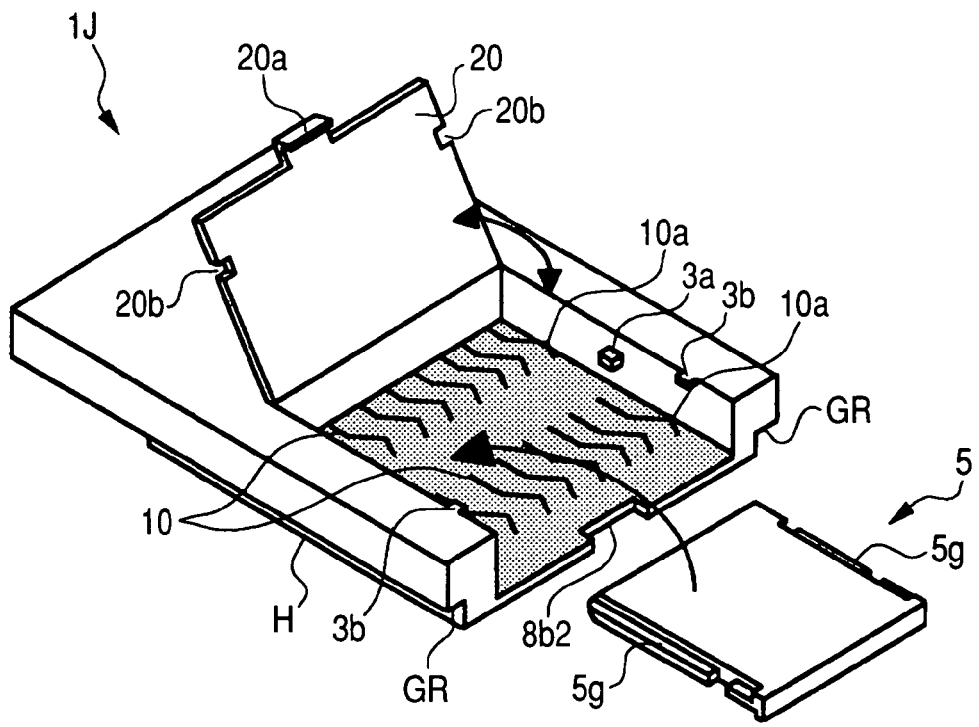
FIG. 38 is an entire perspective view of an adapter for a memory card as seen from an upper surface side according to a still further embodiment of the present invention.
Figure 39:
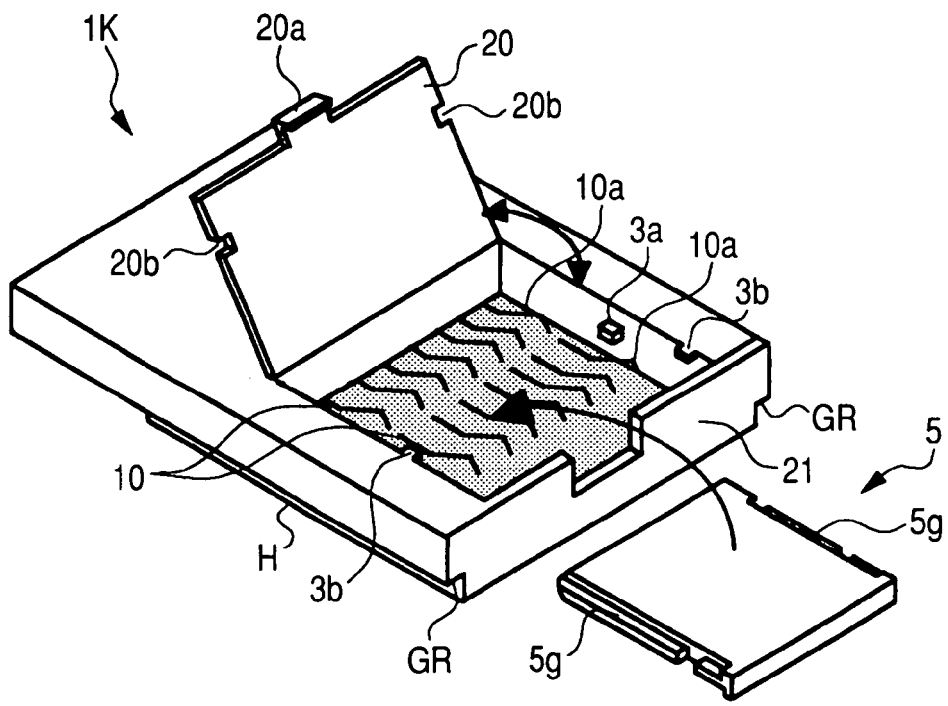
FIG. 39 is an entire perspective view of an adapter for a memory card as seen from an upper surface side of which adapter is a modification of the adapter of FIG. 38.

FIG. 38 is an entire perspective view of an adapter according to a seventh embodiment of the present invention as seen from an upper surface side and FIG. 39 is an entire perspective view of an adapter as seen from an upper surface side which adapter is a modification of the adapter of FIG. 38. In the drawings there is illustrated a memory card 5 in which, say, twenty external terminals 6 are arranged in two rows.

In this seventh embodiment, an opening 3 for inserting and taking out the memory card 5 into and from the card receiving space 9 is formed in an upper surface of each of adapters 1J and 1K. The opening 3 can be opened and closed with a lid 20. The lid 20 is formed of resin or metal for example and is supported on the upper surface side of each of the adapters 1J and 1K in a state in which it can be opened and closed with a hinge portion.

In the adapter 1J of FIG. 38, a convex retaining portion 20a is integrally formed at an end of the lid 20. When the lid 20 is closed, the retaining portion 20a is positioned on the rear side of the memory card 5 present within the card receiving space 9 and functions to prevent the memory card 5 from falling out of the adapter 1J against the will of the user. With the retaining portion 20a, there is no fear of occurrence of such an inconvenience of the memory card 5 is pulled out by mistake from the interior of the adapter 1J. On a side face of a slot which constitutes the opening 3 of the adapter 1J there is formed a protruding portion 3a. The protruding portion 3a is provided to determine the position (height from the bottom of the slot which constitutes the opening 3) of the memory card 5 when the memory card is inserted into the opening 3. Therefore, the memory card 5 can be fixed stably upon insertion thereof. Although only one protruding portion 3a is provided in the illustrated example, plural such protruding portions 3 may be provided, whereby the memory card 5 can be fixed in a more stable manner.

A recess 8b2 is formed in the bottom of the slot which constitutes the opening 3. Upon insertion of the memory card 5, the recess 8b 2 comes into fitting engagement with the retaining portion 20a of the lid 20, whereby the memory card 5 can be loaded stably to the adapter 1J.

The lid 20 has recesses (slots) 20b formed in sides different from the side where the retaining portion 20a is provided. Further, protruding portions 3b separate from the protruding portion 3a are formed on side faces of the slot which constitutes the opening 3. The protruding portions 3b are each formed at a position closer to the surface of the adapter 1J with respect to the protruding portion 3a. When the memory card 5 is inserted into the adapter, the protruding portions 3a and 3b are fitted in the memory card, whereby the memory card can be loaded to the adapter 1J in a more stable manner. Thus, since the retaining portion 20a and the recesses 20b are formed on different sides of the lid 20, there are obtained three support points upon insertion of the lid 20 into the adapter 1J. Consequently, the memory card 5 can be loaded in a much more stable manner than in the case of the retaining portion 20a alone with only one support point. Although in the illustrated example the recesses 20b and the protruding portions 3b are each formed at two positions, it goes without saying that a more stable loading of the memory card can be effected by providing each of them in a larger number than two.

In the adapter 1K of FIG. 39, a retaining plate 21 is provided on the rear side of the adapter 1K. A recess 21a is formed centrally in the transverse direction of the retaining plate 21. When the lid 20 is closed, the retaining portion 20a of the lid 20 is fitted in the recess 21a of the retaining plate 21 in a satisfactory manner. According to such a configuration, also in the case of the adapter 1K, there is no fear of occurrence of an inconvenience such that the memory card 5 present within the adapter 1K is pulled out by mistake. Like the adapter 1J, the adapter 1K is also provided with the protruding portions 3a, 3b and recesses 20b, whereby it is possible to obtain the same effects as in the case of the adapter 1J described above.

Eighth Embodiment

Figure 40:
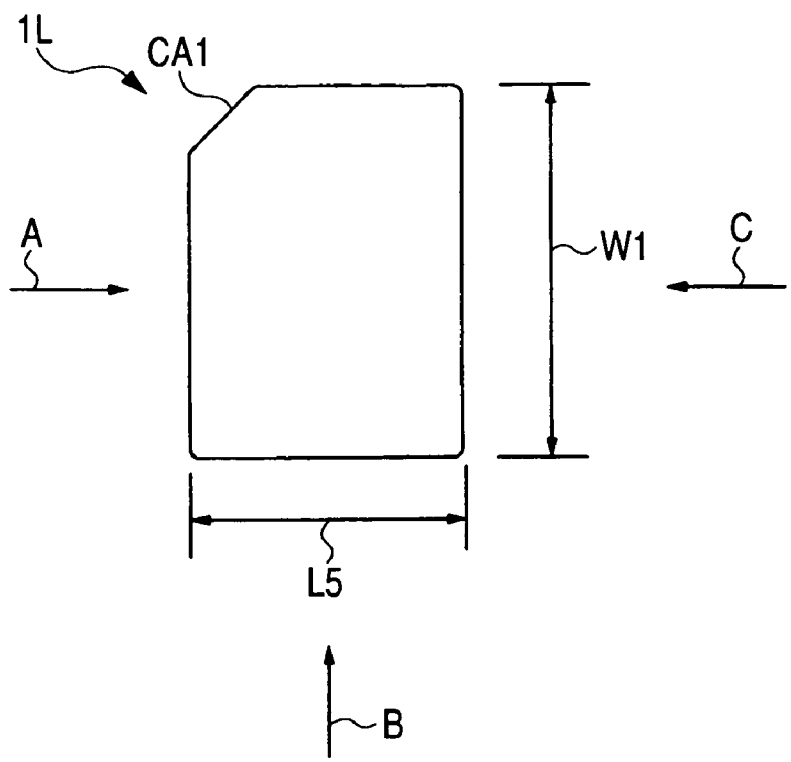
FIG. 40 is an entire plan view of an upper surface of an adapter for a memory card according to a still further embodiment of the present invention.
Figure 41:
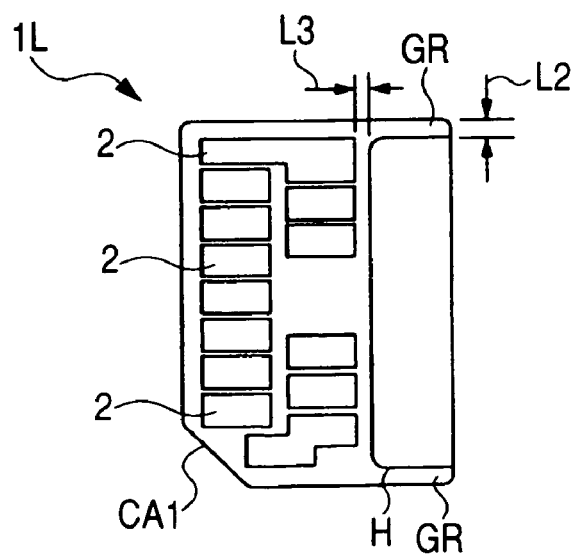
FIG. 41 is an entire plan view of a back surface thereof.
Figure 42:
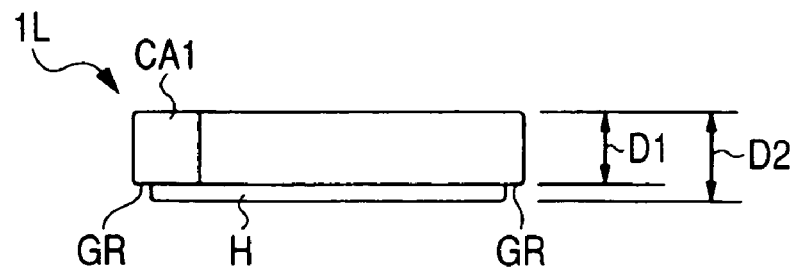
FIG. 42 is a front view of the adapter as seen in the direction of arrow A in FIG. 40.
Figure 43:
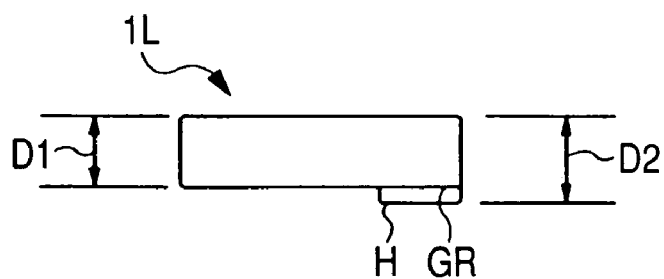
FIG. 43 is a side view of the adapter as seen in the direction of arrow B in FIG. 40.
Figure 44:
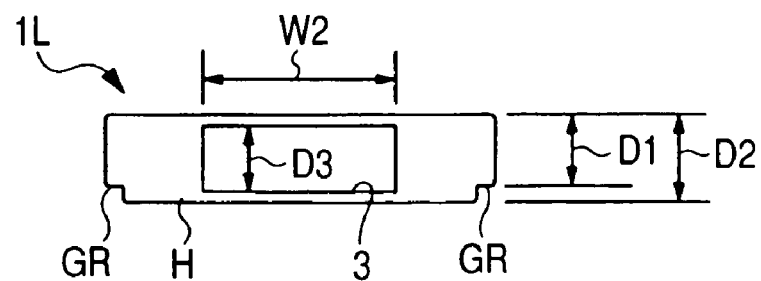
FIG. 44 is a rear view of the adapter as seen in the direction of arrow C in FIG. 40.

FIG. 40 is an entire plan view of an upper surface of an adapter according to an eighth embodiment present invention, FIG. 41 is an entire plan view of a back surface of the adapter of FIG. 40, FIG. 42 is a front view of the adapter as seen in the direction of arrow A in FIG. 40, FIG. 43 is a side view of the adapter as seen in the direction of arrow B in FIG. 40, and FIG. 44 is a rear view of the adapter as seen in the direction of arrow C in FIG. 40.

An adapter 1L according to this eighth embodiment has the same planar size (standardized) as that of the so-called RSMMC (a memory card of the first size or IC card), e.g., 24 mm in width W1 and 18 mm in length L5 and has a card receiving space which can receive therein the foregoing extremely small-sized memory card (a memory card of the second size or IC card) smaller than the RSMMC. The illustrated adapter is one which functions as an adapter especially for HSMMC among RSMMCs. By inserting the extremely small-sized memory card into the card receiving space of the adapter 1L, the adapter becomes employable as an auxiliary storage device in any of various portable electronic devices, including the foregoing information processors, image processors and communication devices.

Also in this eighth embodiment the thickness size (standardized) of the adapter 1L is different from the standardized size of RSMMC, and the adapter 1L has a first portion which is relatively thin and a second portion which is relatively thick.

The first portion which is relatively thin has a thickness D1 of, say, 1.4 mm which is the same as the thickness size (standardized) of the ordinary RSMMC. As in the first embodiment, a terminal region and guide rail regions GR are arranged on a back surface of the adapter 1L. For example, thirteen external terminals 2 are arranged in two rows in the transverse direction of the adapter 1L (in the longitudinal direction of the extremely small-sized memory card or in the direction of insertion of the extremely small-sized memory card into the adapter 1L) in an exposed state to the exterior. The guide rail regions GR are the same as in the first embodiment.

On the other hand, in the relatively thick, second portion thicker than the first portion, a protuberant portion H is formed on the back surface of the adapter 1L. The thickness D2 of the relatively thick, second portion is the same as in the first embodiment. A planar layout of the protuberant portion H in the relatively thick, second portion is the same as in the second embodiment. That is, in the adapter 1L of this eighth embodiment, the protuberant portion H in the relatively thick, second portion is formed over the rear face of the adapter 1L from a position spaced a length L3 from the outer periphery of the second row (rear row) of external terminals 2. A planar layout of the protuberant portion H may be such a layout as in the first embodiment. Further, an opening 3 is formed in the rear face of the adapter 1L. The shape and size of the opening 3 are the same as in the first embodiment.

Figure 45:
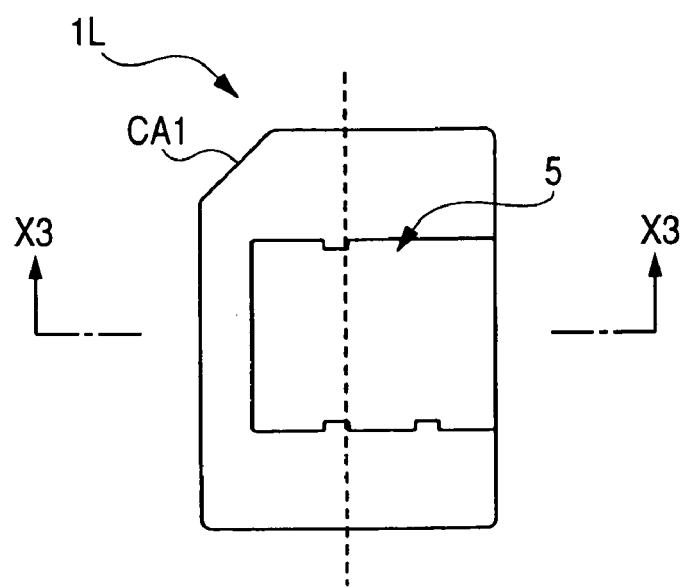
FIG. 45 is an entire plan view of the upper surface of the adapter after loading thereto a memory card of an extremely small size.
Figure 46:
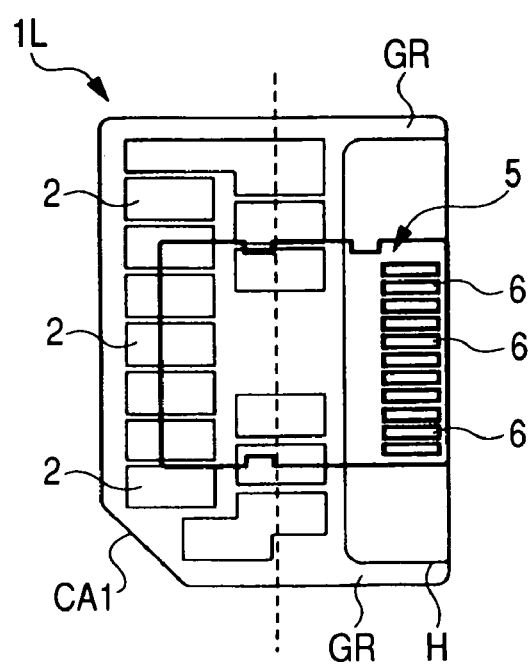
FIG. 46 is an entire plan view of the back surface of the adapter after loading thereto the extremely small-sized memory card.
Figure 47:
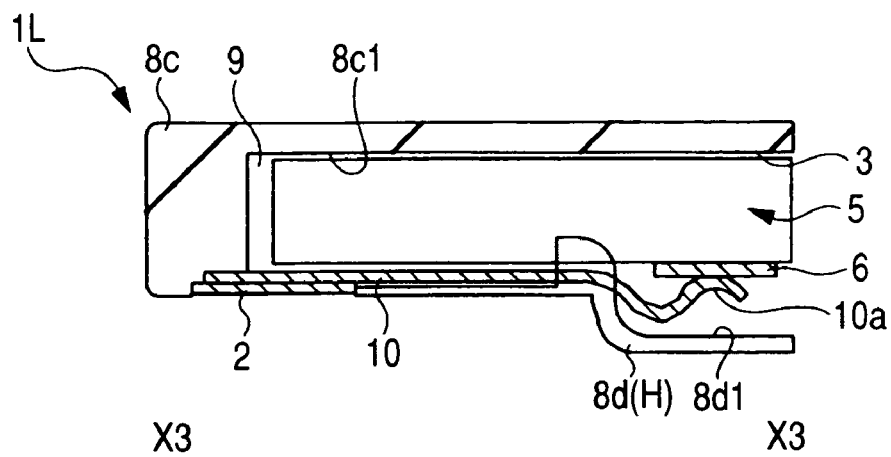
FIG. 47 is a sectional view taken on line X3-X3 in FIG. 45.
Figure 48:
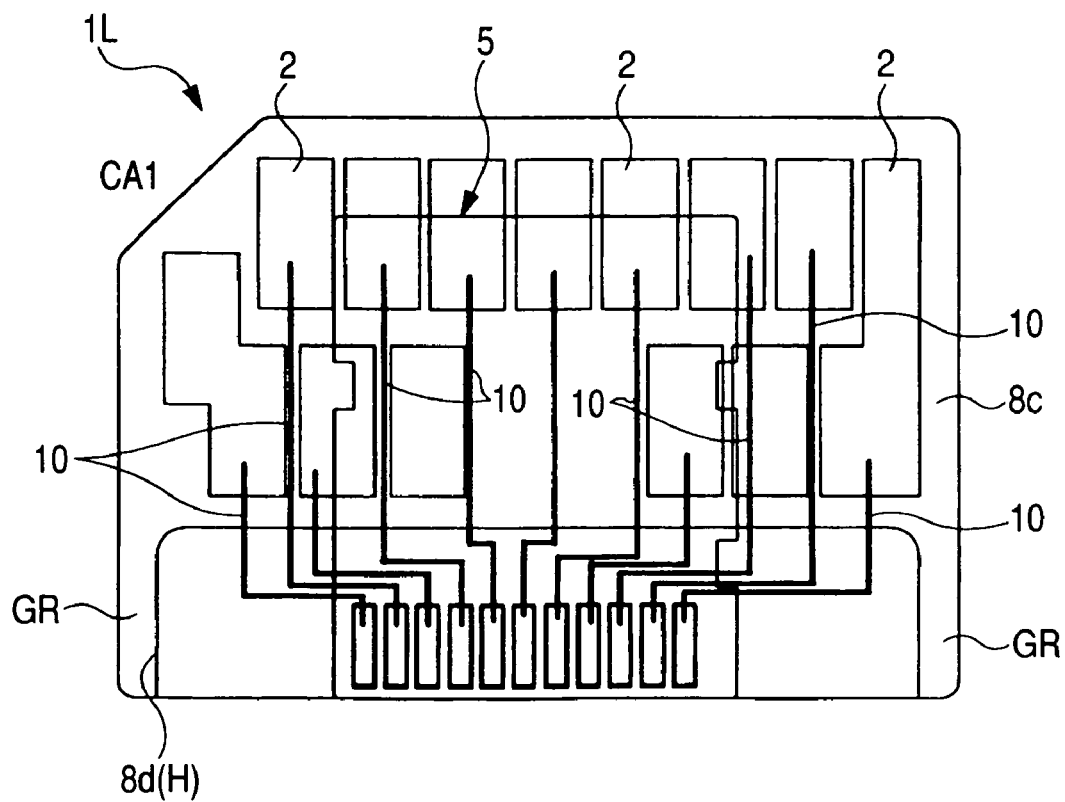
FIG. 48 is a plan view of the adapter, showing an example of layout of connector wiring within the adapter.

Next, FIG. 45 is an entire plan view of the upper surface of the adapter after loading thereto of an extremely small-sized memory card, FIG. 46 is an entire plan view of the back surface of the adapter after loading thereto of the extremely small-sized memory card, FIG. 47 is a sectional view taken on line X3-X3 in FIG. 45, and FIG. 48 is a plan view of the adapter, showing an example of layout of connector wiring within the adapter. In FIGS. 45, 46 and 48, the memory card present within the adapter 1L is shown in a see-through state. Broken lines in FIGS. 45 and 46 each represent the center in the transverse direction of the adapter 1L (in the longitudinal direction of the memory card 5 or in the direction of insertion of the memory card 5 into the adapter 1L).

The configuration of the memory card 5 is the same as in the first to seventh embodiments. In this case, the length in the longitudinal direction of the memory card 5 is larger than half of the length in the transverse direction of the adapter 1L. The memory card 5 is inserted with its rear side ahead into the adapter 1L. The reason is that, in the case of RSMMC, the length in the direction of insertion of the memory card 5 is shorter than MMC and that therefore, if the memory card 5 is inserted with its front side ahead into the adapter 1L, the external terminals 6 of the memory card 5 are positioned in the layout region (terminal region) of the external terminals 2 of the adapter 1L, thus making it impossible to arrange therein the internal terminals 10a of the adapter 1L.

The adapter 1L includes a first case (first housing) 8c on its upper surface side and a second case (second housing) 8d on its back surface side. The first case 8c has an upper surface (first surface) and a back surface (second surface) which are positioned on mutually opposite sides in the thickness direction of the adapter 1L. The plural external terminals 2 are arranged on the back surface of the first case 8c and the second case 8d is joined to the back surface of the first case.

In the adapter 1L, the portion of only the first case 8c is the relatively thin, first portion having the thickness D1, while the joined portion between the first and second cases 8c, 8d is the relatively thick, second portion having the thickness D2. That is, the second portion 8d forms the protuberant portion H. Recesses 8c1 and 8d1 formed respectively in the opposed surfaces of the first and second cases 8c, 8d overlap each other to form the card receiving space 9. The card receiving space 9 is positioned centrally in the width direction (longitudinal direction) of the adapter 1L. The material and configuration of the first and second cases 8c, 8d are the same as those of the first and second cases 8a, 8b described above.

The external terminals 2 are electrically connected respectively to one ends of connector lines (wiring lines) 10. Opposite ends of the connector lines 10 extend into the card receiving space 9 and are electrically connected to internal terminals 10a which are formed integrally at extending ends of the connector lines 10. The configuration of the connector lines 10 and that of the internal terminals 10a are the same as those described in the first embodiment. Of the plural connector lines 10, predetermined connector lines 10 are disposed in right and left vacant regions (especially in the relatively thick, second portion) in the width direction (transverse direction) of the memory card 5, as shown in FIG. 48, whereby the connector lines 10 can be disposed within a thin and small area of the adapter 1L. That is, the thickness of the second portion of the adapter 1L is set to such a thickness D2 as covers the sum of both thickness of the memory card 5 and height of the connector lines 10, whereby the space for both memory card 5 and connector lines 10 can be ensured within the adapter 1A.

Ninth Embodiment

Figure 49:
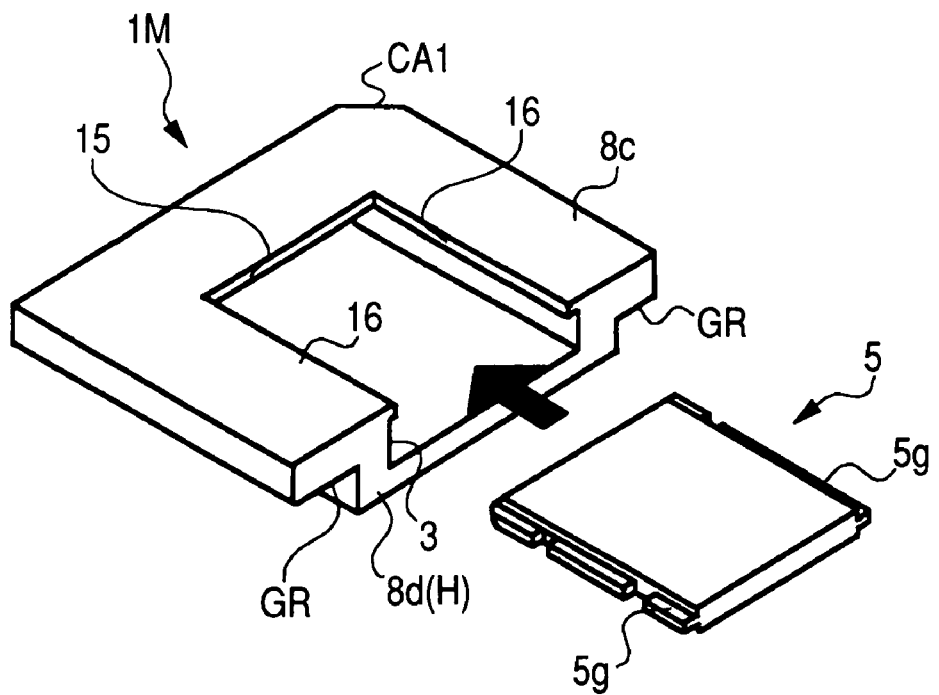
FIG. 49 is an entire perspective view of an adapter for a memory card as seen from an upper side according to a still further embodiment of the present invention.
Figure 50:
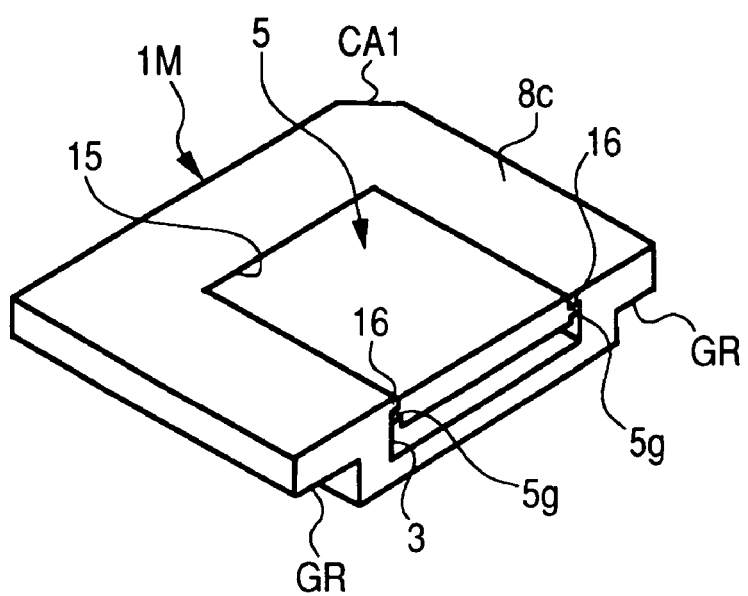
FIG. 50 is an entire perspective view of the adapter of FIG. 49 as seen from the upper surface side after loading of a memory card thereto.

FIG. 49 is an entire perspective view of an adapter according to a ninth embodiment of the present invention as seen from an upper surface side and FIG. 50 is an entire perspective view of the adapter of FIG. 49 as seen from the upper surface side after loading of a memory card thereto.

In this ninth embodiment, as in the fifth embodiment, etc., an opening (second opening) 15 is formed in an upper surface of an adapter 1M for RSMMC so as to extend from the opening 3 toward the card receiving space 9. The guide portions 16 described above are formed at upper positions of both inner side faces of the opening 15. Also in this case, as shown in FIG. 50, When a memory card 5 is inserted into the card receiving space 9, its upper surface assumes an exposed state to the exterior. Also in this ninth embodiment it is possible to obtain the same effects as in the fifth embodiment.

Since the memory card 5 is inserted in the reverse direction, the stopper portion described above is not formed on the rear face of the memory card 5. Other constructional points are the same as in the first to eighth embodiments.

Tenth Embodiment

Figure 51:
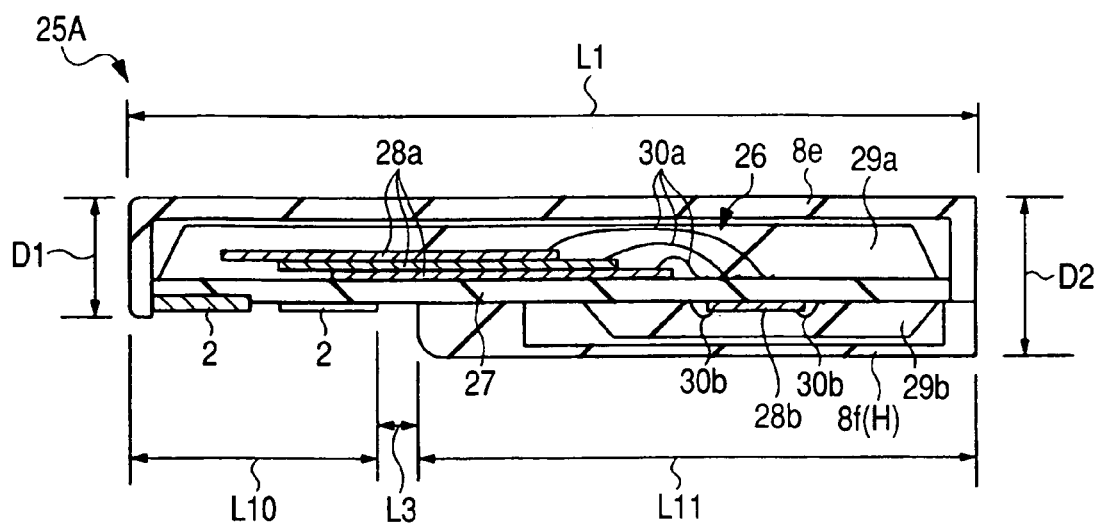
FIG. 51 is a sectional view of a memory card according to a still further embodiment of the present invention as cut in parallel with a side face thereof.
Figure 52:
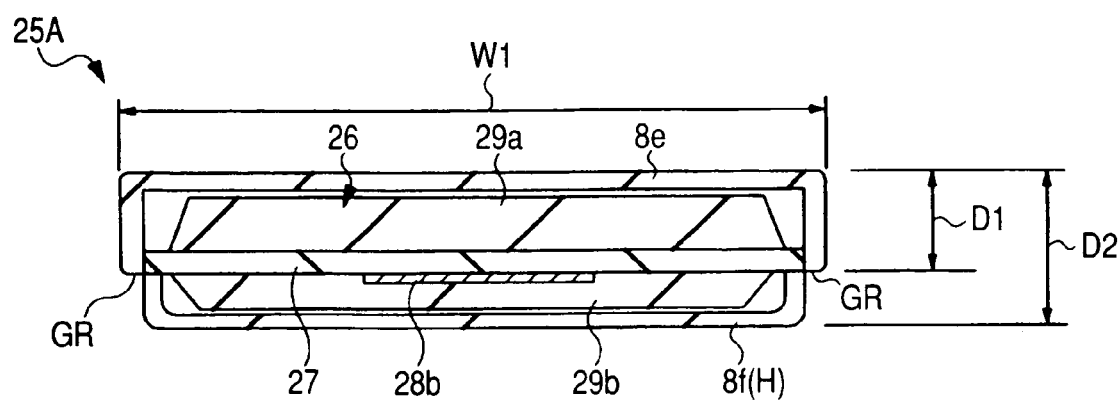
FIG. 52 is a sectional view of the memory card of FIG. 51 as cut in parallel with a rear face thereof.

FIG. 51 is a sectional view of a memory card according to a tenth embodiment of the present invention as cut in parallel with a side face thereof and FIG. 52 is a sectional view of the memory card of FIG. 51 as cut in parallel with a rear face thereof.

A memory card (semiconductor device or IC card) 25A according to this tenth embodiment is employable as an auxiliary storage device in any of various portable electronic devices, including image processors such as digital cameras and communication devices such as portable telephones.

The memory card 25A is constituted by a small thin plate of a rectangular plane shape having a large chamfered portion CA1 for index at one corner for example. It outline dimensions are, for example, 24 mm in width W1, 32 mm in length L1, and 1.4 mm in thickness D1. The memory card 25A has the same planar size and function as those of the so-called full-size MMC. An upper surface (first surface) of the memory card 25A is the same as in FIG. 3, while a back surface (second surface) of the memory card 25A is the same as in FIGS. 4 and 22. Length L10 is, say, about 6.5 mm and length L11 is, say, about 24.7 mm.

However, the thickness size (standardized) of the memory card 25A of this tenth embodiment is different from the standardized size of MMC and the memory card 25A includes a first portion which is relatively thin and a second portion which is relatively thick.

In the relatively thin, first portion, a terminal region and guide rail regions GR are disposed on the back surface of the memory card 25A. The external terminals 2 described above are disposed in the terminal region in an exposed state to the exterior. The layout of the external terminals 2 is the same as in the first to ninth embodiments. The guide rail regions GR are also the same as in the first embodiment. On the other hand, in the relatively thick, second portion which is thicker than the first portion there is formed a protuberant portion H which protrudes slightly in a direction away from the back surface of the memory card 25A. The thickness D2 of the relatively thick, second portion is set at, say, about 1.6 to 2.1 mm (preferably 1.6 to 1.7 mm).

The memory card 25A includes a first case (first housing) 8e, a second case (second housing) 8f and a memory body 26.

The memory body 26 includes a wiring substrate 27, plural semiconductor chips (hereinafter referred to simply as chips) 28a mounted on a main surface (first surface) of the wiring substrate 27, a sealing portion (first resin sealing body) 29a which seals the chips 28a, a chip (electronic part) 28a mounted on a back surface (second surface) of the wiring substrate 27, and a sealing portion (second resin sealing body) 29b which seals the chip 28a.

The wiring substrate 27 which constitutes the memory body 26 includes the main surface (first surface) and the back surface (second surface) which are opposite to each other in the thickness direction of the wiring substrate. The wiring substrate 27 is constituted by, for example, one or two or more multiple metal wiring layers (wiring lines) disposed within an insulator such as, for example, glass fabric-based epoxy resin. Wiring lines on the main surface (first surface) of the wiring substrate 27 are electrically connected via through holes to the wiring lines on the back surface (second surface) of the wiring substrate 27 and the plural external terminals 2. The external terminals 2 are for electric connection between the memory card 25 and the electronic device, with terminals of the electronic device being brought into contact with the external terminals 2.

Flash memory circuits which contribute to the storage of information are formed respectively on the plural chips 28a provided on the main surface of the wiring substrate 27, providing a total memory capacity of, say, 16 M bytes (128 M bits), 32 M bytes (256 M bits), or 64 M bytes (512 M bits). In the illustrated example, the plural chips 28a for memory are stacked in the thickness direction of the wiring substrate 27, whereby a large capacity can be ensured at a small occupied area. Of course, a desired memory capacity may be obtained by arranging the plural chips 28a for memory on the main surface of the wiring substrate 27. The chips 28a are electrically connected respectively to the wiring lines of the wiring substrate 27 through bonding wires (hereinafter referred to simply as wires) 30a and are thereby further connected electrically to the chip 28b and the external terminals 2. For example, the wires 30a are gold (Au) wires.

The sealing portion 29a which seals the plural chips 28a is formed using a thermosetting resin such as, for example, an orthocresol novolak type epoxy resin or a biphenyl type epoxy resin and it is one of principal objects thereof to seal the chips 28a and the wires 30a in a satisfactory manner. Within the sealing portion 29a are included plural fine fillers of quartz glass, e.g., silicon dioxide ($SiO_2$), harder than the resin for improving the mechanical strength, low hygroscopicity and moldability and for adjusting (lowering) the thermal expansion coefficient with respect to the sealing portion 29a for example. Further included in the sealing portion 29a are an accelerator (a catalyst for accelerating the reaction of the resin), a mold release agent, a flame retardant and a colorant. As the colorant there are used carbon grains. The first case 8e is joined over the whole main surface of the wiring substrate 27 so as to cover the sealing portion 29a. The material of the first case 8e is the same as that of the first case 8a.

On the other hand, a controller circuit for controlling the operation of the flash memory circuit of each of the chips 28a for example is formed in the chip 28b mounted on the back surface of the wiring substrate 27. The chip 28b is electrically connected to wiring lines on the wiring substrate 27 through wires 30b and is electrically connected through the wiring lines to the chips 28a for memory and the external terminals 2. The wires 30b are formed of gold (Au) for example. Since the chip 28b is disposed on the back surface of the wiring substrate 27, it is possible to dispose a large number of chips 28a for memory on the main surface side of the wiring substrate 27. Consequently, the memory capacity can be increased without changing the planar size of the memory card 25A.

The chip 28b may be substituted, for example, by a dielectric antenna, a ferrite part for Blue Tooth, or a chip part (electronic part) having a passive element such as coil, capacitor or resistor (e.g., pull-up resistor). In this case, the passive element can be disposed closer to the flash memory circuit and control circuit and hence it is possible to improve electrical characteristics of the memory card 25A.

The sealing portion 29b which seals the chip 28b is formed of the same material as that of the sealing portion 29a and it is one of main objects thereof to seal the chip 28b and the wires 30b in a satisfactory manner. The case 8f is joined to the back surface of the wiring substrate 27 at a position spaced a length L3 from the second row (rear row) of external terminals 2 of the memory card 29b so as to cover the sealing portion 29b. The protuberant portion H is formed by the second case 8f. The reason why the spacing from the second row of external terminals 2 is set at L3 is the same as that set forth in the first embodiment. The material of the second case 8f is the same as that of the first case 8a.

Eleventh Embodiment

Figure 53:
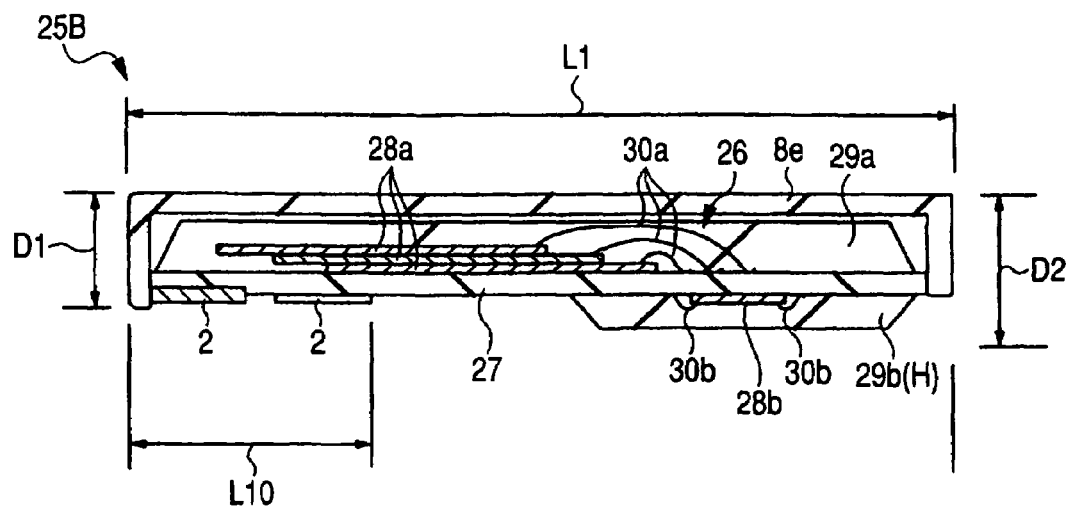
FIG. 53 is a sectional view of a memory card according to a still further embodiment of the present invention as cut in parallel with a side face thereof.
Figure 54:
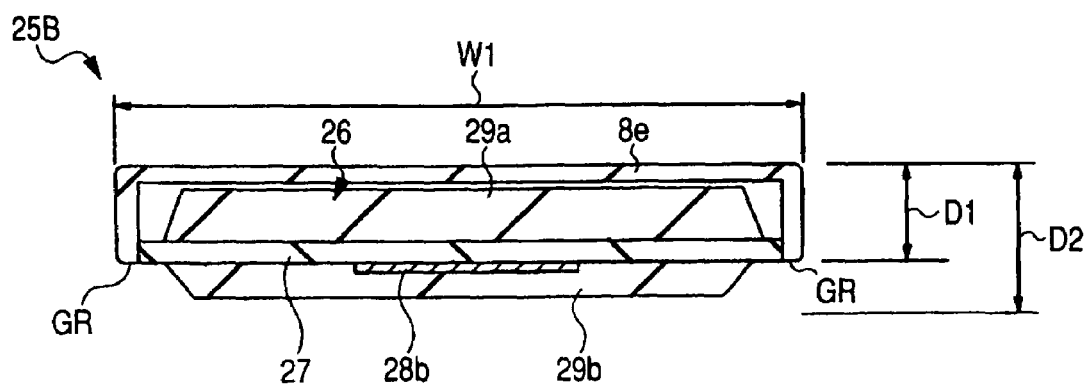
FIG. 54 is a sectional view of the memory card of FIG. 53 as cut in parallel with a rear face thereof.

FIG. 53 is a sectional view of a memory card according to an eleventh embodiment of the present invention as cut in parallel with a side face thereof and FIG. 54 is a sectional view of the memory card of FIG. 53 as cut in parallel with a rear face thereof.

In a memory card 25B of this eleventh embodiment, the second case 8f described above is not joined to a back surface of the memory card 25B and a sealing portion 29b is exposed to the exterior. In this case, a protuberant portion H corresponds to only the thickness of the sealing portion 29b, so that the thickness D2 of the second portion can be made smaller than in the case of the memory card 25A of the tenth embodiment. Since the sealing portion 29b is exposed, there is a fear that constituent portions such as terminals and guide rails of the electronic device may be damaged or deteriorated by for example fillers contained in the sealing portion 29b. In this case, it is preferable to make the amount of fillers contained in the sealing portion 29b smaller than that contained in the main surface-side sealing portion 29a or use fillers smaller in particle diameter than the fillers contained in the sealing portion 29a. Other constructional points are the same as in the tenth embodiment.

Twelfth Embodiment

Figure 55:
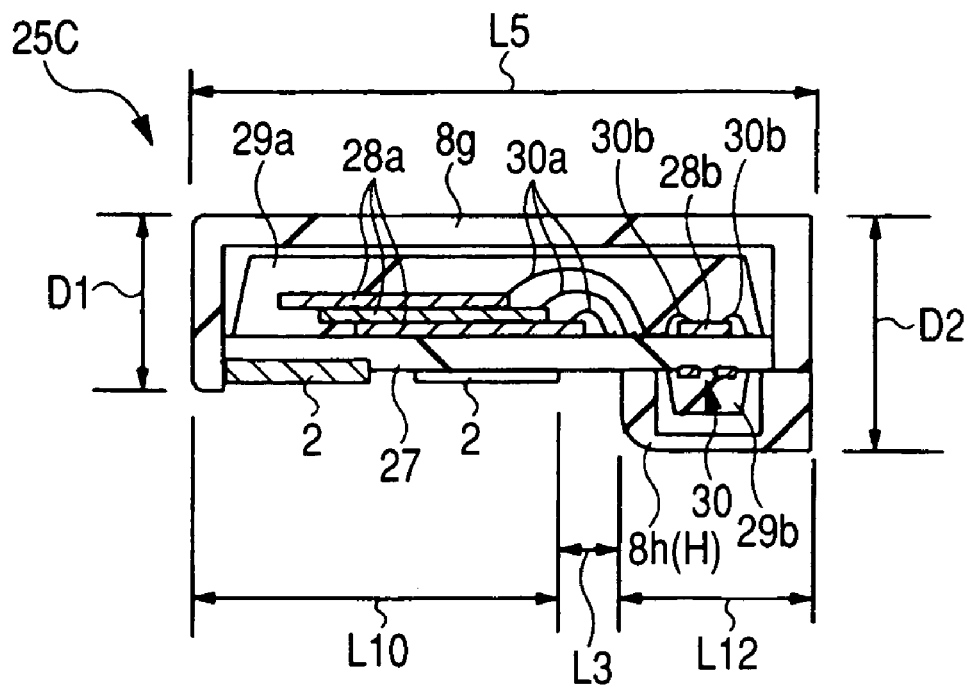
FIG. 55 is a sectional view of a memory card according to a still further embodiment of the present invention as cut in parallel with a side face thereof.
Figure 56:
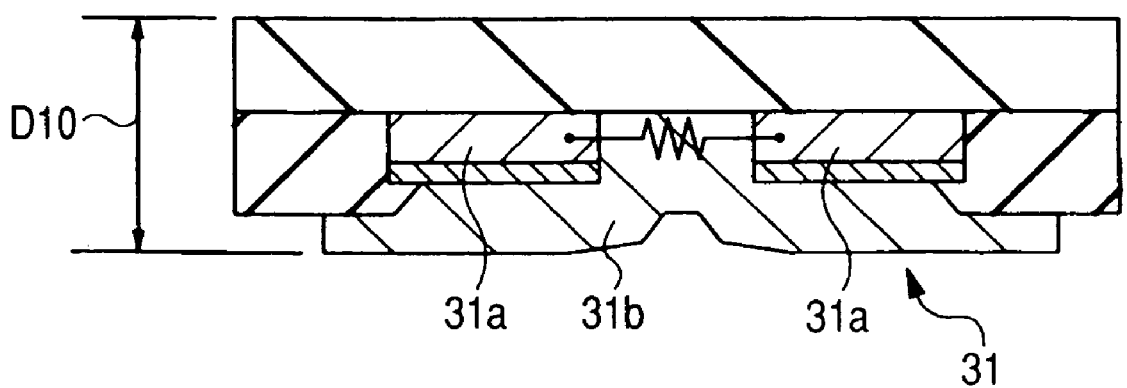
FIG. 56 is an enlarged sectional view of a principal part of a second portion on a back surface side of the memory card of FIG. 55.

FIG. 55 is a sectional view of a memory card according to a twelfth embodiment of the present invention as cut in parallel with a side face thereof and FIG. 56 is an enlarged sectional view of a principal part of a second portion on a back surface side of the memory card of FIG. 55.

A memory card (semiconductor device or IC card) according to this twelfth embodiment has the same planar size and function as those of the so-called RSMMC, e.g., 24 mm in width W1 and 18 mm in length L5. An upper surface (first surface) of the memory card 25C is the same as in FIG. 40 and a back surface (second surface) thereof is the same as in FIG. 41. Length L12 is, say, about 10.6 mm.

Also in the case of the memory card 25C of this embodiment, its thickness size (standardized) is different from the standard of RSMMC and the memory card 25C includes a first portion which is relatively thin and a second portion which is relatively thick. The relatively thin, first portion has a thickness D1 equal to the thickness size (standardized) of the ordinary RSMMC, e.g., 1.4 mm.

In the relatively thin, first portion, a terminal region and guide rail regions GR are disposed on the back surface of the memory card 25C. As in the first to eleventh embodiments, external terminals are arranged in the terminal region in an exposed state to the exterior. The guide rail regions GR are also the same as in the first embodiment. On the other hand, in the relatively thick, second region which is thicker than the first region there is formed a protuberant portion H which slightly protrudes in a direction away from the back surface of the memory card 25C. The relatively thick, second portion has a thickness D2 of, say, about 1.6 to 2.1 mm (preferably 1.6 to 1.7 mm).

The memory card 25C includes a first case (first housing) 8g, a second case (second housing) 8h, and a memory body 26.

The memory body 26 includes a wiring substrate 27, plural chips 28a, 28a mounted on a main surface (first surface) of the wiring substrate 27, a sealing portion (first resin sealing body) 29a for sealing the chips 28a and 28b, a passive element (electronic part) 31 mounted on a back surface (second surface) of the wiring substrate 27, and a sealing portion (second resin sealing body) 29b for sealing the passive element 31. The wiring substrate 27, chips 28a, 28b and sealing bodies 29a, 29b are the same as in the tenth and eleventh embodiments.

It is one of principal objects of the sealing portion 29b to seal the passive element 31 in a satisfactory manner. Also in the memory card 25C, the second case 8h described above is jointed to the back surface of the wiring substrate 27 so as to cover the sealing portion 29b at a position spaced a distance L3 from the second row (rear row) of external terminals 2 of the memory card. The protuberant portion H is formed by the second case 8h. The reason why the spacing is set at the length L3 is the same as that set forth in the first embodiment. The material of the first and second cases 8g, 8h is the same as that of the first case 8a described above.

In the illustrated example, a pull-up resistor is shown as the passive element 31 which resistor is connected in series with an external terminal 2 for signal to prevent the occurrence of ringing waveform of a high-speed signal. The passive element 31 includes electrodes 31a spaced apart a desired distance from each other and carbon paste 31b which is deposited so as to bridge the electrodes 31a. The electrodes 31a are formed, for example, by plating the surface of a copper (Cu) body with silver (Ag) and are connected electrically to the aforesaid external terminal 2 and chips 28a, 28b through wiring lines of the wiring substrate 27. A resistor (pull-up resistor) is formed by the carbon paste 31b present between the adjacent electrodes 31a. For example, a printing method is used to form such a pull-up resistor. Thickness D1 is, say, about 100 μm.

When the pull-up resistor is formed within a chip, there occur variations in resistance value due to a heat treatment which is performed during fabrication of the chip, and thus it is impossible to form within a chip a pull-up resistor for which a high accuracy is required. On the other hand, if the pull-up resistor is disposed on the electronic device side, it may be impossible to obtain satisfactory electrical characteristics because of a too long distance between memory circuit and control circuit. In this twelfth embodiment, it is possible to improve the resistance value setting accuracy in comparison with the case where the resistor is formed within a chip. Moreover, since the passive element 31 for the pull-up resistor is provided on the back surface of the memory card 25C, it is possible to shorten the distance from the passive element 31 to the chips 28a for memory and the chip 28b for control. As a result, it is possible to improve the electrical characteristics of the memory card 25C. The pull-up resistor may be substituted by, for example, a dielectric antenna, a ferrite part for Blue Tooth, or another passive element 31 having a thickness falling under the range of the thickness D2 such as a coil or a capacitor.

Thirteenth Embodiment

Figure 57:
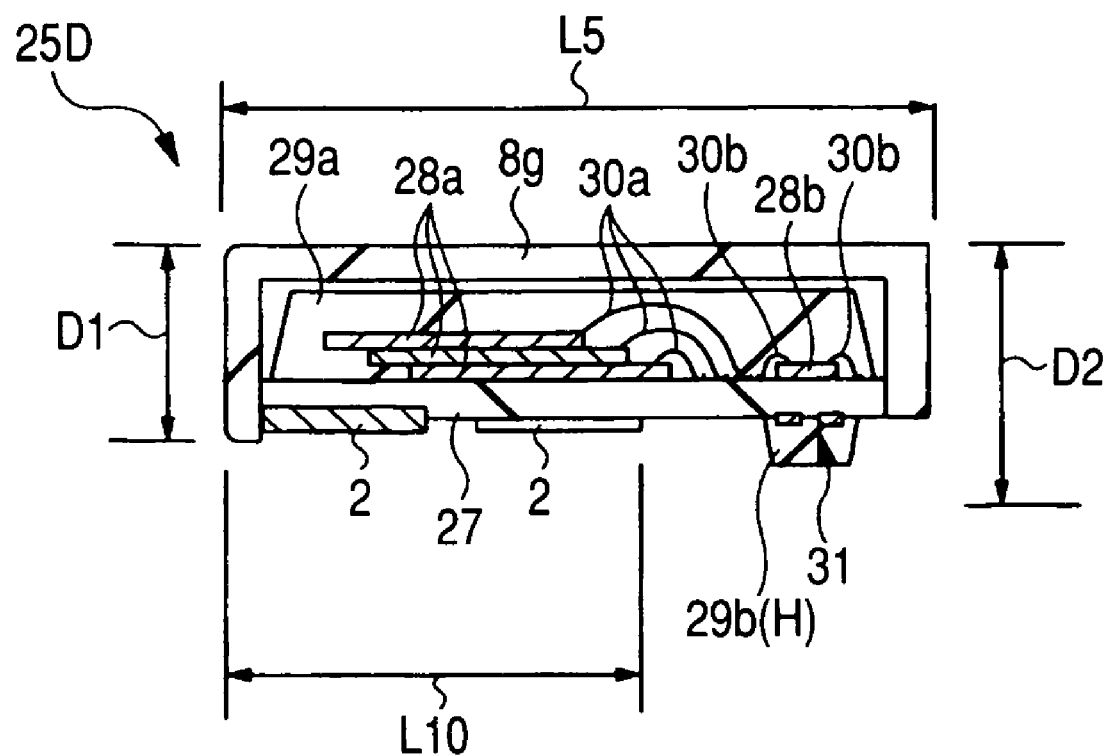
FIG. 57 is a sectional view of a memory card according to a still further embodiment of the present invention as cut in parallel with a side face thereof.

FIG. 57 is a sectional view of a memory card according to thirteenth embodiment of the present invention as cut in parallel with a side face thereof.

In a memory card 25D of this thirteenth embodiment, the second case 8h described above is not joined to a back surface of the memory card 25D, but a sealing portion 29b is exposed to the exterior. In this case, a protuberant portion H corresponds to only the thickness of the sealing portion 29b and therefore it is possible to make the thickness of the second portion D2 smaller than in the memory card 25C of the twelfth embodiment. Since the sealing portion 29b is exposed, there is a fear of damage or deterioration of terminals of the electronic device or such components as guide rails by for example fillers contained in the sealing portion 29b. In this case, it is preferable to make the amount of fillers contained in the sealing portion 29b smaller than that of fillers contained in the main surface-side sealing portion 29a or use fillers smaller in particle size than the fillers contained in the sealing portion 29a. Other constructional points are the same as in the twelfth embodiment.

Although the present invention has been described above concretely by way of embodiments thereof, it goes without saying that the invention is not limited to the above embodiments, but that various changes may be made within the scope not departing from the gist of the invention.

For example, although in the tenth to thirteenth embodiments each chip and the wiring substrates are electrically connected with each other through wires, no limitation is made thereto. The chip and the wiring substrates may be electrically connected with each other through bump electrodes. In this case, the chip is mounted on the wiring substrate through bump electrodes in a state in which its main surface is opposed to the main surface of the wiring substrate. Components on the main surface of the chip are connected to wiring lines of the wiring substrate through bump electrodes and are further connected electrically to external terminals.

Although the present invention has been described above mainly about the case where it is applied to a portable computer, a digital camera or a portable telephone as a background application field thereof, no limitation is made thereto. The present invention is applicable also to other mobile information processors such as, for example, PDA (Personal Digital Assistants).

INDUSTRIAL APPLICABILITY

The present invention is applicable to the manufacturing industry of memory card adapters and memory cards.

What is claimed is:

1. An adapter for a memory card, having the same planar size as that of a memory card of a first size and having a space for receiving therein a memory card of a second size smaller than the first size,
   wherein the adapter for a memory card has a first surface and a second surface which are disposed on mutually opposite sides in a thickness direction of the adapter, a first portion having the same thickness as the memory card of the first size, and a second portion thicker than the first portion;
   wherein a plurality of first external terminals are disposed in an exposed state to the exterior over the second surface in the first portion of the adapter;
   wherein the space and a first opening for inserting and taking out the memory card of the second size into and from the space are formed in the second portion of the adapter;
   wherein, in the space, there are disposed a plurality of internal terminals with which a plurality of second external terminals of the memory card of the second size is brought into contact and electrically connected; and
   wherein the plurality of internal terminals are electrically connected to the plurality of the first external terminals of the adapter through a plurality of wiring lines.

2. An adapter for a memory card according to claim 1, wherein the plurality of the first external terminals of the adapter are disposed in two rows in a longitudinal direction of the memory card of the second size.

3. An adapter for a memory card according to claim 1, wherein the length in a longitudinal direction of the memory card of the second size is shorter than half of the length of the adapter in the longitudinal direction of the memory card of the second size.

4. An adapter for a memory card according to claim 1, wherein the length in a longitudinal direction of the memory card of the second size is longer than half of the length of the adapter in the longitudinal direction of the memory card of the second size.

5. An adapter for a memory card according to claim 1, wherein the plurality of the second external terminals are disposed on one end side in a longitudinal direction of the memory card of the second size and the memory card of the second size is received into the space in such a manner that the plurality of the second external terminals are positioned in the second portion.

6. An adapter for a memory card according to claim 1, wherein the first opening is formed in a rear face of the adapter.

7. An adapter for a memory card according to claim 6, wherein the first opening and the space are respectively formed with guide portions for assisting movement of the memory card of the second size within the space.

8. An adapter for a memory card according to claim 6, wherein a second opening extending from the first opening toward the space is formed in the first surface of the adapter, and guide portions are formed in inner side faces of the second opening to guide movement of the memory card of the second size and to press the memory card of the second size for preventing disengagement of the memory card of the second size from the space.

9. An adapter for a memory card according to claim 1, wherein the first opening is formed in a side face of the adapter.

10. An adapter for a memory card according to claim 9, wherein guide portions for guiding movement of the memory card of the second size within the space is formed in the first opening and the space.

11. An adapter for a memory card according to claim 9, wherein a second opening extending from the first opening toward the space is formed in the first surface of the adapter and guide portions are formed in inner side faces of the second opening to guide movement of the memory card of the second size and to press the memory card of the second size for preventing disengagement of the memory card of the second size from the space.

12. An adapter for a memory card according to claim 1, wherein the first opening is formed in the first surface of the adapter and a lid is attached to the first opening in a state in which it can be opened and closed.

13. An adapter for a memory card, having the same planar size as that of a memory card of a first size and having a space for receiving therein a memory card of a second size smaller than the first size, the adapter for a memory card comprising:
   a first housing, the first housing having a first surface and a second surface which are disposed in mutually opposite sides in a thickness direction of the adapter;
   a plurality of first external terminals disposed in an exposed state to the second surface of the first housing;
   a second housing joined to the second surface of the first housing so as to form the space between it and the first housing positioned spaced away from an area where the plurality of the first external terminals are disposed;
   a plurality of wiring lines extending from the plurality of the first external terminals of the adapter into the space; and
   a plurality of internal terminals formed on an end side of the wiring lines extending into the space and with which a plurality of second external terminals of the memory card of the second size are brought into contact within the space; and
   a thickness of the area where the plurality of the internal terminals of the adapter are disposed is larger than a thickness of the area where the plurality of the first external terminals of the adapter are disposed.

14. An adapter for a memory card according to claim 13, wherein the plurality of the first external terminals of the adapter are disposed in two rows in a longitudinal direction of the memory card of the second size.

15. An adapter for a memory card according to claim 13, wherein the plurality of the second external terminals of the memory card of the second size are disposed on one end side in a longitudinal direction of the memory card of the second size and the memory card of the second size is received into the space in such a manner that the plurality of the second external terminals are positioned on an end side opposite in the longitudinal direction of the memory card of the second size to an end side of the adapter where the plurality of the first external terminals are disposed.

* * * * *